US012641737B2

(12) United States Patent
Hong et al.

(10) Patent No.: US 12,641,737 B2
(45) Date of Patent: May 26, 2026

(54) DISPLAY APPARATUS

(71) Applicant: SAMSUNG ELECTRONICS CO., LTD., Suwon-si (KR)

(72) Inventors: Daegun Hong, Suwon-si (KR); Kyungmin Lee, Suwon-si (KR); Sejun Choi, Suwon-si (KR); Yongyeon Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 172 days.

(21) Appl. No.: 18/406,998

(22) Filed: Jan. 8, 2024

(65) Prior Publication Data

US 2024/0306325 A1     Sep. 12, 2024

Related U.S. Application Data

(63) Continuation of application No. PCT/KR2023/021255, filed on Dec. 21, 2023.

(30) Foreign Application Priority Data

Mar. 10, 2023     (KR) ........................ 10-2023-0032054
Mar. 29, 2023     (KR) ........................ 10-2023-0041360

(51) Int. Cl.
     *H05K 5/02*               (2006.01)
(52) U.S. Cl.
     CPC ................................... *H05K 5/0217* (2013.01)
(58) Field of Classification Search
     CPC ........................... H05K 5/0017; H05K 5/0217
     USPC ................ 361/807, 809, 810, 801, 803, 759
     See application file for complete search history.

(56) References Cited

U.S. PATENT DOCUMENTS

| | | |
|---|---|---|
| 8,315,070 B2 | 11/2012 | Yee et al. |
| 8,953,323 B2 | 2/2015 | Hwang |
| 10,234,708 B2 | 3/2019 | Kim et al. |
| 10,234,724 B2 | 3/2019 | Lee et al. |
| 10,244,643 B1 | 3/2019 | Yun et al. |
| 10,371,972 B2 | 8/2019 | Shin et al. |
| 10,401,016 B2 | 9/2019 | Coo |

(Continued)

FOREIGN PATENT DOCUMENTS

| | | |
|---|---|---|
| KR | 10-0965252 | 6/2010 |
| KR | 10-2013-0078661 | 7/2013 |

(Continued)

OTHER PUBLICATIONS

International Search Report dated Apr. 24, 2024 for International Application No. PCT/KR2023/021255.

(Continued)

*Primary Examiner* — Hung S. Bui
(74) *Attorney, Agent, or Firm* — STAAS & HALSEY LLP

(57)     ABSTRACT

A display apparatus including a display; a rear cover behind the display; a support plate between the display and the rear cover, the support plate supporting the display; a control board between a portion of the display and the support plate, the control board configured to control the display; and a board holder fixed to the control board, wherein the board holder and the support plate are configured so that the board holder is slidably mountable on the support plate so as to be hooked to the support plate and thereby mounted on the support plate between the control board and the support plate.

15 Claims, 23 Drawing Sheets

(56)                References Cited

U.S. PATENT DOCUMENTS

| | | | |
|---|---|---|---|
| 10,578,901 | B2 | 3/2020 | Lee et al. |
| 10,709,026 | B2 | 7/2020 | Kim et al. |
| 10,732,446 | B2 | 8/2020 | In et al. |
| 11,385,679 | B2 | 7/2022 | Pyo et al. |
| 2007/0126328 | A1* | 6/2007 | Cho .................... H05K 7/20963 |
| | | | 313/46 |
| 2018/0246378 | A1* | 8/2018 | Lee .................... G02F 1/133603 |
| 2021/0026590 | A1* | 1/2021 | Nam ...................... B60K 35/26 |
| 2022/0342255 | A1 | 10/2022 | Kang et al. |
| 2023/0021970 | A1 | 1/2023 | Lee et al. |

FOREIGN PATENT DOCUMENTS

| | | |
|---|---|---|
| KR | 10-1565935 | 11/2015 |
| KR | 10-2016-0136114 | 11/2016 |
| KR | 10-2017-0001361 | 1/2017 |
| KR | 10-2018-0022307 | 3/2018 |
| KR | 10-2018-0076200 | 7/2018 |
| KR | 10-2018-0097984 | 9/2018 |
| KR | 10-1905841 | 10/2018 |
| KR | 10-1945890 | 2/2019 |
| KR | 10-2116932 | 5/2020 |
| KR | 10-2131663 | 7/2020 |
| KR | 10-2309317 | 10/2021 |
| KR | 10-2022-0020910 | 2/2022 |
| KR | 10-2022-0163336 | 12/2022 |
| KR | 10-2022-0163915 | 12/2022 |
| WO | WO 2019/004505 A1 | 1/2019 |
| WO | WO 2019/066095 A1 | 4/2019 |

OTHER PUBLICATIONS

Written Opinion of the International Searching Authority dated Apr. 24, 2024 for International Application No. PCT/KR2023/021255.

* cited by examiner

DISPLAY APPARATUS

CROSS-REFERENCE TO RELATED APPLICATIONS

This application is a continuation application, under 35 U.S.C. § 111(a), of International Application No. PCT/KR2023/021255, filed Dec. 21, 2023, which claims priority under 35 U.S.C. § 119 to Korean Patent Application No. 10-2023-0032054, filed Mar. 10, 2023 and Korean Patent Application No. 10-2023-0041360, filed Mar. 29, 2023, in the Korean Intellectual Property Office, the disclosures of which are incorporated by reference herein in their entireties.

BACKGROUND

1. Field

The disclosure relates to a display apparatus, and more particular, to a display apparatus including a display panel and a control board.

2. Description of Related Art

A display apparatus is a kind of an output apparatus that converts obtained or stored electrical information into visual information and displays the visual information to a user, and the display apparatus is used in various fields, such as home or workplace.

The display apparatus is classified into a light-emitting type using a display panel that emits light by itself, such as an organic light-emitting diode (OLED), and a light-receiving type using a display panel that needs to receive light from a backlight unit, such as a liquid crystal display (LCD).

A display apparatus including a self-luminous display panel may not include a backlight unit and thus the display apparatus may have a thin design. As for the display apparatus including the self-luminous display panel, due to this thin design, it may be difficult to disassemble the display panel from the display apparatus, and further, it may be difficult to disassemble the display panel without damage to a control board that is configured to control the display panel.

SUMMARY

Therefore, it is an aspect of the disclosure to provide a display apparatus capable of easily mounting and disassembling a display panel.

It is another aspect of the disclosure to provide a display apparatus capable of separating a control board from a display panel without damage.

Additional aspects of the disclosure will be set forth in part in the description which follows and, in part, will be obvious from the description, or may be learned by practice of the disclosure.

According to an embodiment of the disclosure, a display apparatus includes a display; a rear cover behind the display; a support plate between the display and the rear cover, the support plate supporting the display; a control board between a portion of the display and the support plate, the control board configured to control the display; and a board holder configured to fix the control board, wherein the board holder and the support plate are configured so that the board holder is slidably mountable on the support plate so as to be hooked to the support plate and thereby mounted on the support plate between the control board and the support plate.

According to an embodiment of the disclosure, the display apparatus may further include a hook protruding from the board holder toward the support plate; and an insertion hole formed in the support plate into which the hook is insertable. The hook may be configured to become inserted in the insertion hole based on the board holder is slidably mounted on the support plate to thereby hook the board holder to the support plate.

According to an embodiment of the disclosure, the display apparatus may further include a central hook protruding toward the support plate from a middle portion of the board holder in a lengthwise direction of the board holder; a first insertion hole formed in the support plate into which the central hook is insertable; a side hook protruding toward the support plate from a position between the central hook and an end portion of the board holder in the lengthwise direction of the board holder; and a second insertion hole formed in the support plate into which the side hook is insertable. The central hook may be configured to become inserted in the first insertion hole, and the side hook may be configured to become inserted in the second insertion hole, based on the board holder is slidably mounted on the support plate to thereby hook the board holder to the support plate.

According to an embodiment of the disclosure, each of the central hook and the side hook may include a protrusion protruding rearward from the board holder, and a stopper extending from the protrusion in a direction different from a protruding direction of the protrusion.

According to an embodiment of the disclosure, the board holder may be slidably mountable on the support plate such that the board holder is positionable in a first position in which the central hook and the side hook are inserted into the support plate, and the board holder is positionable in a second position in which the board holder slides downward and the central hook and the side hook are mounted on the support plate.

According to an embodiment of the disclosure, the first insertion hole may include a first portion into which the central hook is inserted at the first position of the board holder, and a second portion provided below the first portion and having a cross-sectional area that is less than a cross-sectional area of the first portion so that the central hook is mounted on the support plate at the second position of the board holder, and the second insertion hole may include a first portion into which the side hook is inserted at the first position of the board holder, and a second portion provided below the first portion and having a cross-sectional area that is less than a cross-sectional area of the first portion so that the side hook is mounted on the support plate at the second position of the board holder.

According to an embodiment of the disclosure, the support plate may include a contact protrusion protruding rearward to prevent separation of the stopper of the central hook at the second position of the board holder.

According to an embodiment of the disclosure, a front surface of the stopper of the central hook and a rear surface of the contact protrusion may be in contact at the second position of the board holder.

According to an embodiment of the disclosure, the support plate may include an inner protrusion protruding into the second insertion hole to prevent separation of the stopper of the side hook at the second position of the board holder.

According to an embodiment of the disclosure, a front surface of the stopper of the side hook and a rear surface of the inner protrusion may be in contact at the second position of the board holder.

According to an embodiment of the disclosure, the rear cover, the support plate, and the board holder may be fastened by a fastening member inserted from a rear side of the rear cover.

According to an embodiment of the disclosure, the control board may be attached to the display at a lower portion of the display.

According to an embodiment of the disclosure, the display apparatus may further include an adhesive member attaching the display to the support plate and the board holder.

According to an embodiment of the disclosure, the adhesive member may include a first adhesive member between the display and the support plate, attaching the display to the support plate, and extending longitudinally in a vertical direction; and a second adhesive member between the display and the board holder, attaching the display to the board holder, and positioned below the first adhesive member.

According to an embodiment of the disclosure, the display may be configured to be separated from the support plate together with the board holder based on the board holder being separated from the support plate.

BRIEF DESCRIPTION OF THE DRAWINGS

These and/or other aspects of the disclosure will become apparent and more readily appreciated from the following description of embodiments, taken in conjunction with the accompanying drawings of which:

FIG. 3 is an exploded-perspective view of the display apparatus according to an embodiment of the disclosure;

DETAILED DESCRIPTION

Figure 1:
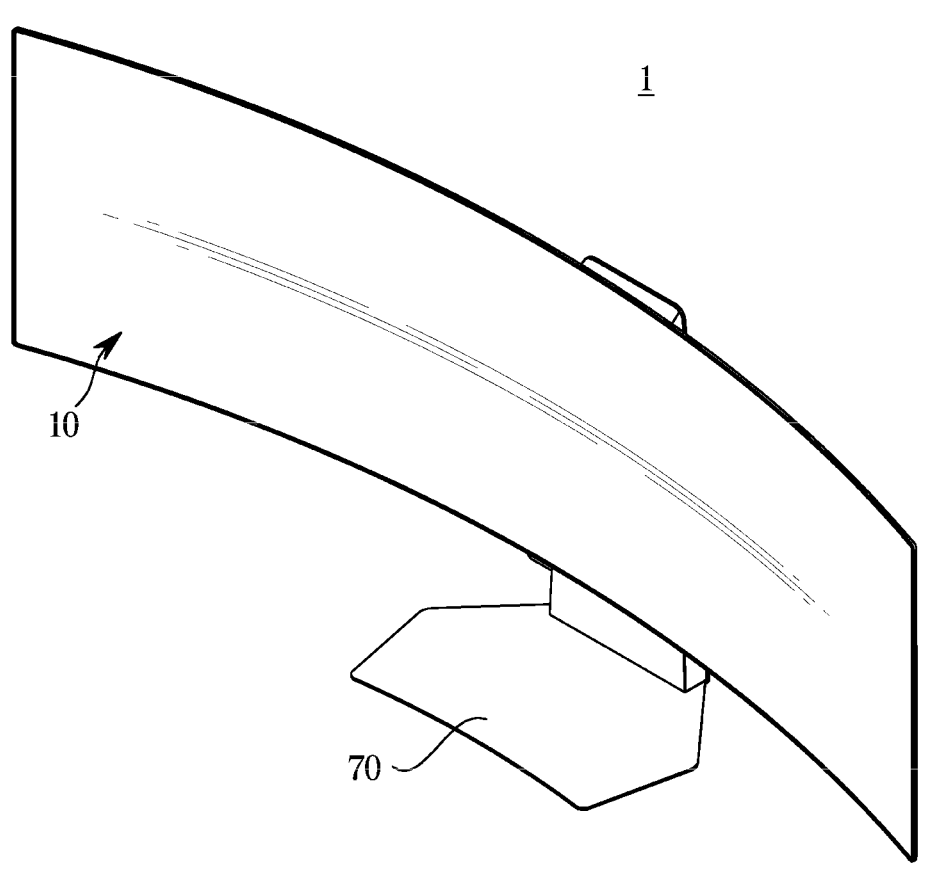
FIG. 1 is a perspective view of a display apparatus according to an embodiment of the disclosure.
Figure 1:
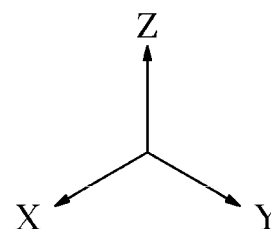

Embodiments described in the disclosure and configurations shown in the drawings are merely examples of embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

Additionally, in the present disclosure, the meaning of 'identical' includes properties that are similar to each other or are similar within a certain range. Also, 'identical' means 'substantially identical'. It should be understood that 'substantially identical' means that values that fall within the margin of error in manufacturing or values that fall within a range that has no meaning compared to the standard value are included in the scope of 'identical'.

In the following detailed description, the terms of "forward", "rearward", "left side", "right side" and the like may be defined by the drawings, but the shape and the location of the component is not limited by the terms.

For example, an X direction in which a display faces in FIG. 1 may be defined as "forward", a Y direction may be defined as "left side", and a Z direction may be defined as "upward". However, a shape and a location of a display apparatus is not limited thereto.

Reference will now be made in detail to embodiments of the disclosure, examples of which are illustrated in the accompanying drawings.

Figure 2:
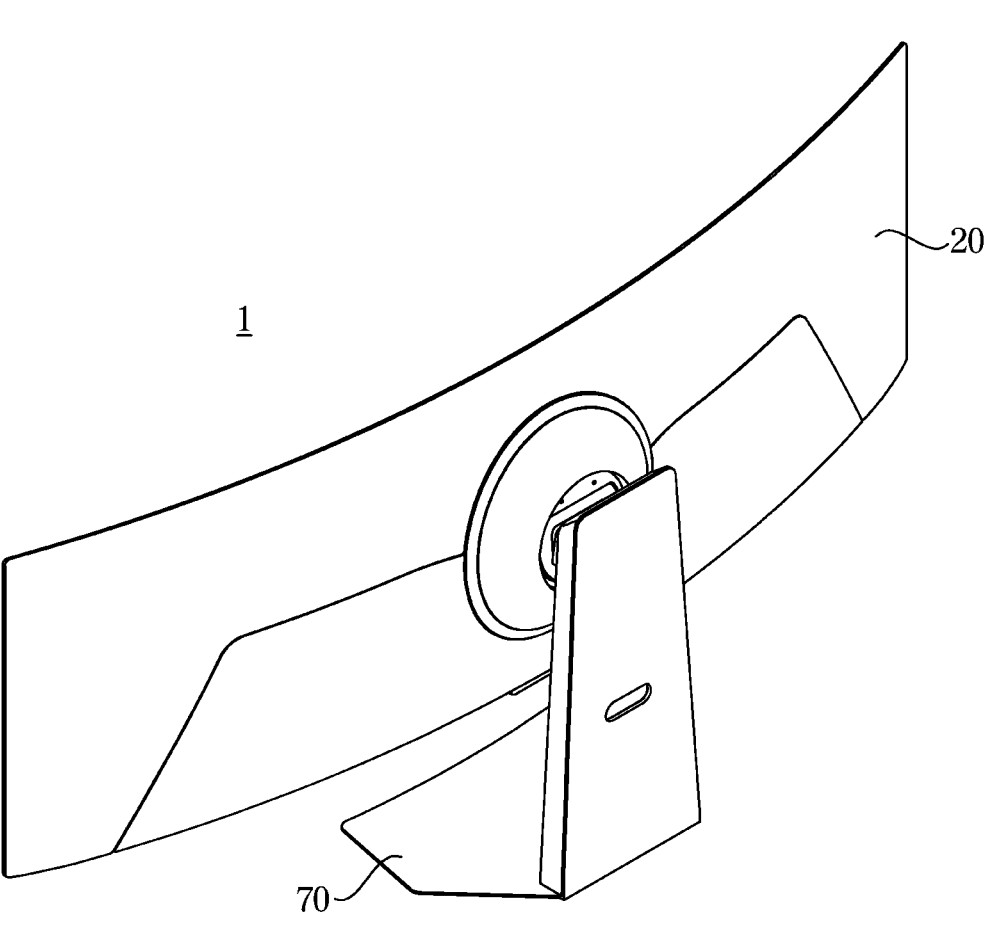
FIG. 2 is a perspective view of the display apparatus according to an embodiment of the disclosure.
Figure 2:
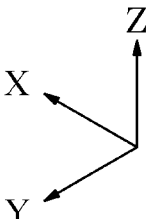

FIG. 1 is a perspective view of a display apparatus according to an embodiment. FIG. 2 is a perspective view of the display apparatus according to an embodiment. FIG. 1 is a front-perspective view of the display apparatus when viewed from the front, and FIG. 2 is a rear-perspective view of the display apparatus when viewed from the rear.

Referring to FIGS. 1 and 2, a display apparatus 1 is a device that processes an image signal received from an outside and visually displays the processed image. Hereinafter a case in which the display apparatus 1 is a monitor is exemplified, but the disclosure is not limited thereto. For example, the display apparatus 1 may be implemented in various forms, such as a television (TV), a portable multimedia device, and a portable communication device, and the display apparatus 1 is not limited in its shape as long as visually displaying an image.

Further, the display apparatus 1 may be a large format display (LFD) installed outdoors, such as a roof of a building or a bus stop. The outdoors is not limited to the outside of a building, and thus the display apparatus 1 according to an embodiment may be installed in any places as long as the display apparatus is accessed by a large number of people, even indoors, such as subway stations, shopping malls, movie theaters, companies, and stores.

The display apparatus 1 may receive content data including video signals and audio signals from various content sources, and output video and audio corresponding to the video signals and the audio signals. For example, the display apparatus 1 may receive content data through a broadcast reception antenna or cable, receive content data from a content playback device, or receive content data from a content providing server of a content provider.

The display apparatus 1 may include a display panel 10. The display panel 10 may display image information. The display panel 10 may be disposed on the frontmost side of the display apparatus 1. The display panel 10 may be referred to as a display 10.

The display apparatus 1 may further include a rear cover 20. A rear exterior of the display apparatus 1 may be formed by the rear cover 20. The rear cover 20 may be referred to as a rear chassis 20. Within the display panel 10, the rear cover 20 may accommodate various components of the display apparatus. For example, a support plate 30 and an inner plate 50 may be positioned between the display panel 10 and the rear cover 20. The rear cover 20 may extend along a circumference of the display panel 10 to cover the circumference of the display panel 10.

The display apparatus 1 may further include a stand 70. The stand 70 may be coupled to the rear cover 20 to support the display apparatus 1. For example, the stand 70 may allow the display apparatus 1 to be supported by the ground or a desk.

Figure 3:
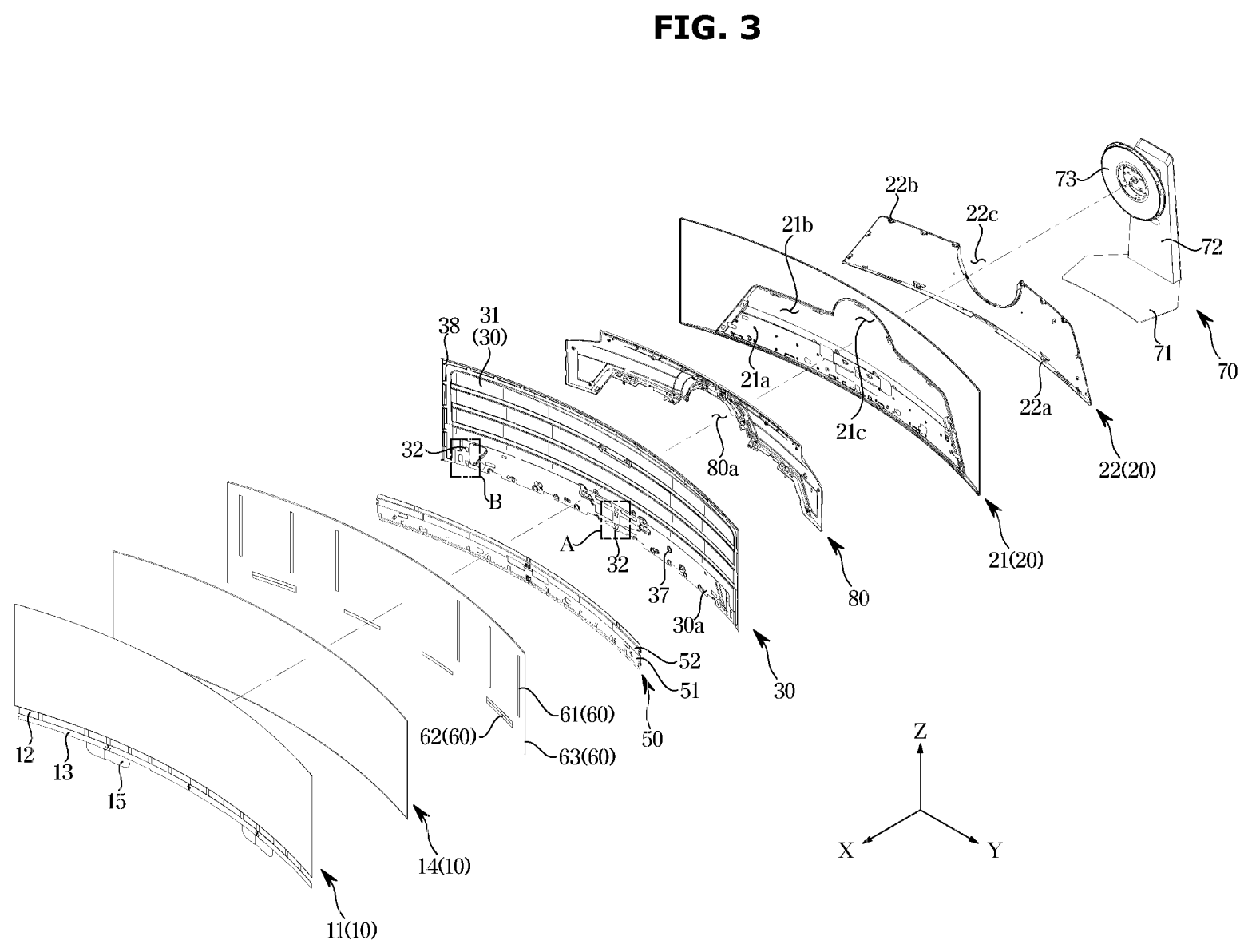
Figure 4:
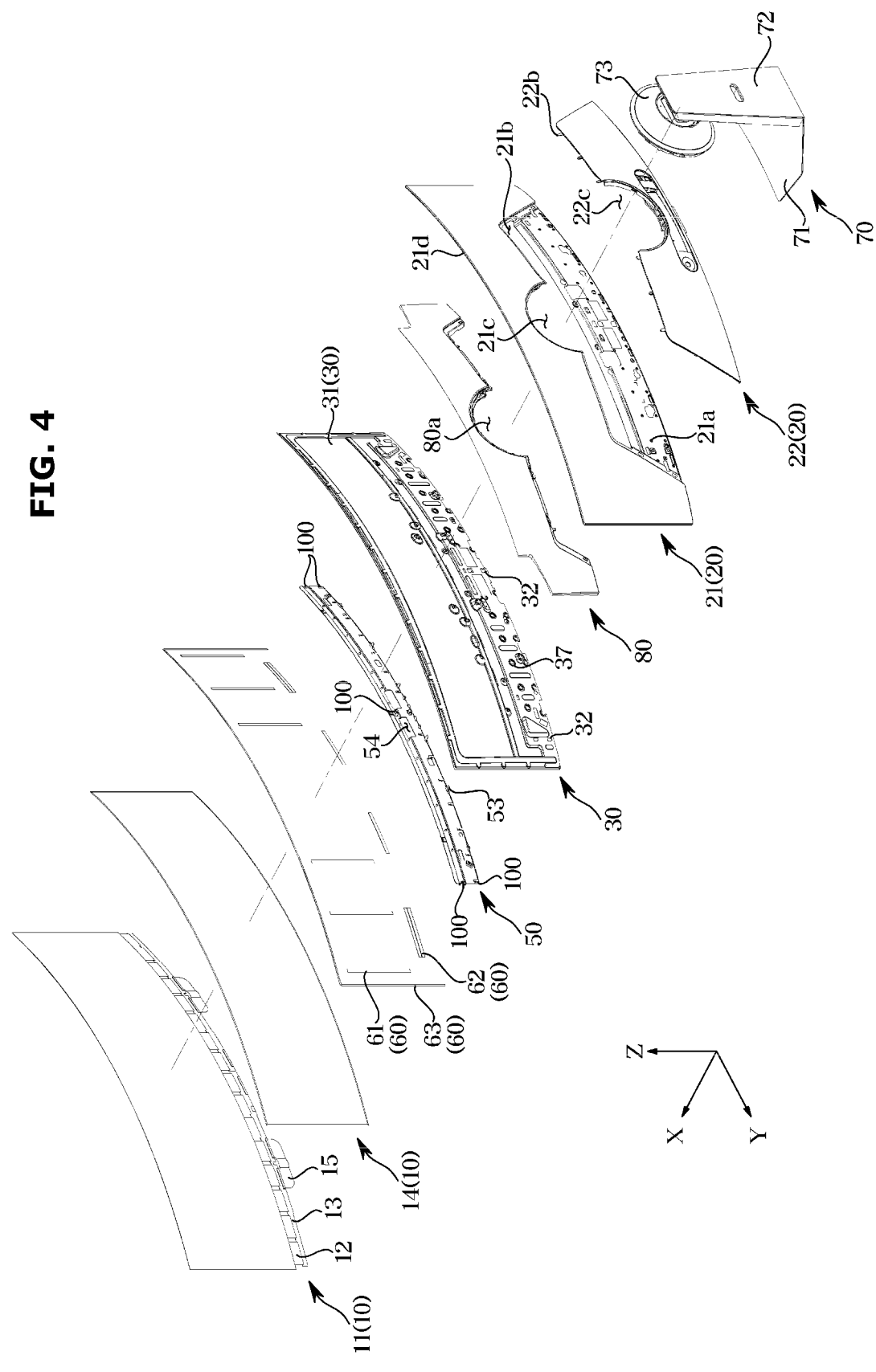
FIG. 4 is an exploded-perspective view of the display apparatus according to an embodiment of the disclosure.

FIG. 3 is an exploded-perspective view of the display apparatus according to an embodiment. FIG. 4 is an exploded-perspective view of the display apparatus according to an embodiment. FIG. 3 is a front exploded-perspective view of the display apparatus according to an embodiment, and FIG. 4 is a rear exploded-perspective view of the display apparatus according to an embodiment.

Referring to FIGS. 3 and 4, the display apparatus 1 according to an embodiment may include the display panel 10.

According to an embodiment, the display panel 10 may include a self-luminous panel 11 configured to emit light by itself and configured to display an image, and a heat dissipation sheet 14 arranged behind the self-luminous panel 11.

The heat dissipation sheet 14 may be attached to a rear surface of the self-luminous panel 11. The heat dissipation sheet 14 may be in contact with the self-luminous panel 11 to dissipate heat generated from the self-luminous panel 11. The heat dissipation sheet 14 may be provided in a size corresponding to the self-luminous panel 11 and may be attached to the rear surface of the self-luminous panel 11 using an adhesive member such as adhesive or double-sided tape (not shown).

The self-luminous panel 11 may be configured to display an image using an organic light emitting device (OLED). The self-luminous panel 11 may not include a backlight unit that is arranged behind the self-luminous panel 11, and thus the self-luminous panel 11 may have a thickness that is less than a non-self luminous panel.

The self-luminous panel 11 may have a curvature. For example, the self-luminous panel 11 may be a curved display panel. For example, the display apparatus according to an embodiment may be a curved monitor. Accordingly, users of the display apparatus can watch videos with an immersive feeling. However, the display apparatus is not limited thereto and may have a flat display panel.

According to an embodiment, a film cable 12 may be provided on a lower end of the self-luminous panel 11. The film cable 12 may be coupled to the self-luminous panel 11 in the form of a chip on film (COF). The film cable 12 may be formed of a flexible material to be bendable. One end of the film cable 12 may be connected to the lower end of the self-luminous panel 11, and the other end of the film cable 12 may be bent and disposed adjacent to a rear surface of the heat dissipation sheet 14.

A control board 13 may be provided at the other end of the film cable 12. The control board 13 may be configured to transmit a signal to drive the self-luminous panel 11. The control board 13 may control the display panel 10 by receiving signals from a main board (not shown). For example, the control board 13 may be a printed circuit board. The control board 13 may be attached to the rear surface of the heat dissipation sheet 14. For example, the control board 13 may be attached to the rear surface of the heat dissipation sheet 14 by an adhesive member such as adhesive or double-sided tape.

The number of the control boards 13 may vary according to a size of the self-luminous panel 11. As the size of the self-luminous panel 11 increases, the number of control boards 13 may increase. The display apparatus 1 may include a connection cable 15 configured to connect two adjacent control boards 13 to each other.

According to an embodiment, the heat dissipation sheet 14 may be attached to the rear surface of the self-luminous panel 11 to dissipate heat generated from the self-luminous panel 11. The heat dissipation sheet 14 may be in contact with the self-luminous panel 11 to effectively absorb heat from the self-luminous panel 11. To this, the heat dissipation sheet 14 and the self-luminous panel 11 may be coupled by an adhesive member (not shown).

The heat dissipation sheet 14 may be formed of at least one of graphite, aluminum, and copper. It is appropriate that the heat dissipation sheet 14 may be formed of graphite.

According to an embodiment, the display panel 10 may be attached and/or bonded to the support plate 30 and the inner plate 50. For example, the heat dissipation sheet 14 may be attached and/or bonded to the support plate 30 and the inner plate 50. For example, the heat dissipation sheet 14 may be attached to the support plate 30 and the inner plate 50 through an adhesive member 60. However, it is not limited thereto, and the display panel 10 may be coupled, fixed, installed, and/or fastened to the support plate 30 and the inner plate 50 through a separate structure.

The display panel 10 may be separable from the support plate 30 and the inner plate 50. For example, it is possible to separate the display panel 10 from the support plate 30 and the inner plate 50 by peeling off the adhesive member 60 that attaches the display panel 10 to the support plate 30 and the inner plate 50. At this time, according to an embodiment, it is possible to prevent the damage to the control board 13 disposed behind the display panel 10.

The display apparatus according to an embodiment may further include the adhesive member 60. For example, the adhesive member 60 may attach the display panel 10 to the support plate 30 and the inner plate 50.

The adhesive member 60 may include a first adhesive member 61 and a second adhesive member 62. The first adhesive member 61 may attach and/or bond the display panel 10 to the support plate 30. The second adhesive member 62 may attach and/or bond the display panel 10 to the inner plate 50.

The display panel 10 may be attached to the support plate 30 through the first adhesive member 61. For example, the first adhesive member 61 may allow the heat dissipation sheet 14 and the support plate 30 to adhere to each other. The first adhesive member 61 may extend in the vertical direction. A plurality of first adhesive members 61 may be provided, and the plurality of first adhesive members 61 may be arranged along the left and right directions. The first adhesive member 61 may be positioned above the second adhesive member 62.

The display panel 10 may be attached to the inner plate 50 through the second adhesive member 62. For example, the second adhesive member 62 may allow the heat dissipation sheet 14 and the inner plate 50 to adhere to each other. The second adhesive member 62 may extend in the left and right directions. A plurality of second adhesive members 62 may be provided, and the plurality of second adhesive members 62 may be arranged along the left and right directions. The second adhesive member 62 may be positioned below the first adhesive member 61.

The adhesive member 60 may include a third adhesive member 63. The third adhesive member 63 may attach and/or bond the display panel 10 to the support plate 30. The third adhesive member 63 may be disposed on an edge portion 38 of the support plate 30. For example, the third adhesive member 63 may allow an upper edge, a left edge, and a right edge of the support plate 30 and the self-luminous panel 11 to adhere to each other.

The display apparatus according to an embodiment may further include the support plate 30.

The support plate 30 may be disposed at the rear of the display panel 10 to support the display panel 10. Further, the support plate 30 may dissipate heat generated from the display panel 10. The support plate 30 may be provided in a size corresponding to the rear cover 20 and in front of the rear cover 20, the support plate 30 may be coupled to the rear cover 20. The support plate 30 may be coupled to the rear cover 20 to reinforce the rigidity of the display apparatus and to dissipate heat generated from the display panel 10. The support plate 30 may be formed of a metal material.

The support plate 30 may include a stepped portion 30*a*. The stepped portion 30*a* may protrude rearward from a support base 31 and may have a step difference from the support base 31. The inner plate 50 may be disposed within the stepped portion 30*a*. The inner plate 50 may be disposed between the display panel 10 and the stepped portion 30*a*.

For example, the stepped portion 30*a* may be formed in a lower portion of the support plate 30.

The support plate 30 may further include an insertion hole 32. The insertion hole 32 may be formed in the support base 31. The insertion hole 32 may accommodate a hook 100 formed on the inner plate 50. The insertion hole 32 and the hook 100 may allow the support plate 30 and the inner plate 50 to be slidably mounted and/or coupled to each other. However, it is not limited thereto, and the insertion hole 32 may be formed in the inner plate 50 and the hook 100 may be formed in the support plate 30. Accordingly, the support plate 30 and the inner plate 50 may be slidably mounted and/or coupled to each other. The hook 100 and the insertion hole 32 may be referred to as a coupling portion. Alternatively, the insertion hole 32 may be referred to as a mounting hole.

In addition, the method of coupling the support plate 30 and the inner plate 50 is not limited to the above example, and the support plate 30 and the inner plate 50 may be coupled, mounted, and/or fastened through a separate structure.

For example, the insertion hole 32 may be formed in a lower portion of the support plate 30. The insertion hole 32 may include a first insertion hole 33 formed in a central portion of the support plate 30 and a second insertion hole 34 formed in a side portion of the support plate 30. For example, a central hook 110 formed on the inner plate 50 may be inserted into the first insertion hole 33 (refer to FIG. 5), and a side hook 120 formed on the inner plate 50 may be inserted into the second insertion hole 34 (refer to FIG. 6).

The support plate 30 may further include a fastening hole 37. The support plate 30 may be fastened to the rear cover 20 and the inner plate 50 through a fastening member 40 inserted into the fastening hole 37.

The display apparatus according to an embodiment may further include the inner plate 50.

The inner plate 50 may be positioned between the display panel 10 and the support plate 30. For example, the inner plate 50 may be disposed in the lower portion of the display panel 10 and the support plate 30. The inner plate 50 may be attached or bonded to the display panel 10 through the second adhesive member 62. The inner plate 50 may be mounted on the support plate 30 through the coupling portions 32 and 100. The inner plate 50 may be referred to as a mounting plate 50.

The inner plate 50 may include a first plate portion 51 and a second plate portion 52. The first plate portion 51 may be a lower plate portion, and the second plate portion 52 may be an upper plate portion. The first plate portion 51 and the second plate portion 52 may have a step difference. The control board 13 may be disposed in a space formed by the step difference between the first plate portion 51 and the second plate portion 52. For example, the control board 13 may be disposed in a region corresponding to the first plate portion 51.

At the rear of the control board 13, the inner plate 50 may cover the control board 13. The inner plate 50 may cover the control board 13 attached to the rear surface of the display panel 10 using double-sided tape. For example, the first plate portion 51 may cover the rear side of the control board 13.

The inner plate 50 may be separated from the support plate 30 together with the display panel 10 while the display panel 10 is being separated from the support plate 30. At this time, the inner plate 50 may be attached to the lower portion of the display panel 10 and cover the control board 13 to prevent the control board 13 from being damaged. For example, because the control board 13 is disposed in the space formed by the first plate portion 51 and the second plate portion 52 of the inner plate 50, the control board 13 may be safely separated without damage while the display panel 10 is being separated from the support plate 30. The inner plate 50 may be referred to as a board holder 50. The inner plate 50 may be injection formed. However, the method of forming the inner plate 50 is not limited to the above example.

The inner plate 50 may further include a fixing protrusion 53. The fixing protrusion 53 may prevent a second cover 22 and the inner plate 50 from being separated. The fixing protrusion 53 may interfere with a fixing portion 22a of the second cover 22 to prevent the second cover 22 and the inner plate 50 from being separated. For example, the fixing protrusion 53 may protrude rearward from the lower end of the inner plate 50. A plurality of the fixing protrusions 53 may be provided.

The inner plate 50 may further include a connecting hole 54. For example, a connector and a wire to which a T-con board (not shown) is connected may pass through the connecting hole 54. For example, the connecting hole 54 may be formed in the central portion of the inner plate 50.

The inner plate 50 may further include the hook 100. The hook 100 may protrude from the plate portions 51 and 52 toward the support plate 30. For example, the hook 100 may extend from the plate portions 51 and 52 toward the support plate 30 so as to be inserted into the insertion hole 32 of the support plate 30. The insertion hole 32 and the hook 100 may allow the support plate 30 and the inner plate 50 to be slidably mounted and/or coupled to each other. However, it is not limited thereto, and the insertion hole 32 may be formed in the inner plate 50 and the hook 100 may be formed in the support plate 30. Accordingly, the support plate 30 and the inner plate 50 may be slidably mounted and/or coupled to each other. The hook 100 and the insertion hole 32 may be referred to as a coupling portion.

In addition, the method of coupling the support plate 30 and the inner plate 50 is not limited to the above example, and the support plate 30 and the inner plate 50 may be coupled, mounted, and/or fastened through a separate structure.

The hook 100 may be formed at the center and both lateral ends of the inner plate 50. The hook 100 may include a first hook and a second hook. For example, the first hook may be formed in the center of the inner plate 50 and pass through the first insertion hole 33 of the support plate 30 (refer to FIG. 5). The first hook may be referred to as the central hook 110. Additionally, the second hook may be formed at both ends along the left and right directions of the inner plate 50 and pass through the second insertion hole 34 of the support plate 30 (refer to FIG. 6). The second hook may be referred to as the side hook 120. Alternatively, the central hook 110 may be referred to as a second hook and the side hook 120 may be referred to as a first hook.

The display apparatus according to an embodiment may further include a middle frame 80.

The middle frame 80 may be disposed between the support plate 30 and the rear cover 20. For example, the middle frame 80 may be disposed at the rear of the support plate 30 and at the front of a first cover 21 to cover a space between the support plate 30 and the rear cover 20. For example, the middle frame 80 may cover the space between the upper portion of the support plate 30 and the first cover 21. The middle frame 80 may further include a stand mounting portion 80a. The stand mounting portion 80a may be formed in a central portion of the middle frame 80.

The display apparatus 1 may further include the rear cover 20. The rear cover 20 may include the first cover 21 and the second cover 22. The first cover 21 may serve as an upper rear cover, and the second cover 22 may serve as a lower rear cover. The first cover 21 and the second cover 22 may not be separated but may be formed integrally to form the rear cover 20. The rear cover 20 may cover the rear side of the display panel 10, the inner plate 50, and the support plate 30, and may cover the circumference of the display panel 10. A circumference portion 21d of the first cover 21 may cover the circumference of the display panel 10.

The first cover 21 may cover the rear upper side and rear lateral side of the display panel 10 and the support plate 30. The first cover 21 may be fastened, coupled, fixed, and/or mounted to the support plate 30 and the inner plate 50 through the fastening member 40 inserted into a fastening hole 21a. The first cover 21 may further include a second cover mounting portion 21b and a stand mounting portion 21c.

The second cover 22 may cover the rear lower portion of the display panel 10 and the support plate 30. The second cover 22 may be mounted on the first cover 21 through the first cover mounting portion 22b. The second cover 22 may be mounted on the second cover mounting portion 21b of the first cover 21. The second cover 22 may further include a stand mounting portion 22c.

The second cover 22 may further include the fixing portion 22a. The fixing portion 22a may prevent the second cover 22 and the inner plate 50 from being separated. The fixing portion 22a may interfere with the fixing protrusion 53 of the inner plate 50 to prevent the second cover 22 and the inner plate 50 from being separated. For example, the fixing portion 22a may protrude forward from the lower end of the second cover 22. A plurality of fixing portions 22a may be provided.

The stand mounting portion 21c, 22c may be formed in a central portion of the rear cover 20 while the first cover 21 and the second cover 22 are coupled. The stand 70 may be mounted on the rear cover 20 through the stand mounting portion 21c, 22c, and the display apparatus may be supported on the ground through the coupling thereof.

The display apparatus 1 may further include the stand 70. The stand 70 may be coupled to and/or mounted on the rear cover 20 to allow the display apparatus to be supported on the ground, etc.

As for the display apparatus according to an embodiment, the stand 70 may include a base 71, a neck 72, and a mounting portion 73.

The base 71 may form a bottom of the stand 70. The base 71 may be supported on the ground or a desk. The base 71 may have a flat shape. The base 71 may be supported on the ground or a desk. The neck 72 may be coupled to one end of the base 71. For example, the neck 72 may be coupled to a rear end of the base 71.

The neck 72 may connect the base 71 and the mounting portion 73. For example, the neck 72 may be disposed between the base 71 and the mounting portion 73 with respect to the vertical direction. The neck 72 may allow a height, at which the display panel 10 displays an image, to be higher than the floor while the stand 70 and the rear cover 20 are coupled to each other. One end of the neck 72 may be connected to the base 71, and the other end of the neck 72 may be connected to the mounting portion 73. For example, a lower end of the neck 72 may be connected to the base 71, and an upper end of the neck 72 may be connected to the mounting portion 73.

The mounting portion 73 may protrude forward from the neck 72. The mounting portion 73 may couple the stand 70 and the rear cover 20. The mounting portion 73 may have a shape corresponding to the stand mounting portion 21c of the rear cover 20. The mounting portion 73 may be inserted into the stand mounting portion 21c.

Hereinafter a process in which the inner plate 50 is mounted and/or fastened to the support plate 30 and the display panel 10 is attached to the inner plate 50 and the support plate 30 will be described.

Figure 5:
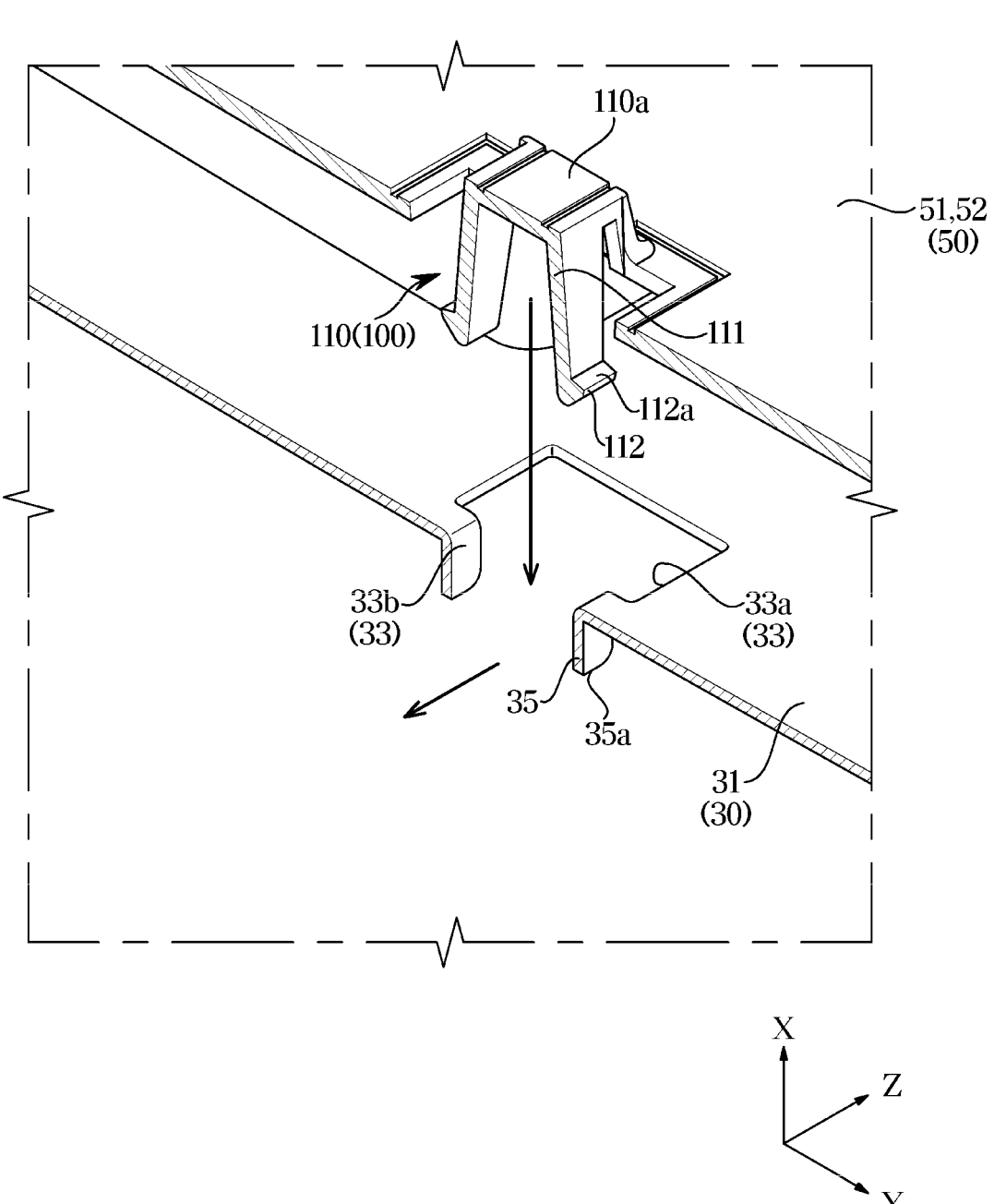
FIG. 5 is an enlarged view of the display apparatus according to an embodiment of the disclosure.
Figure 6:
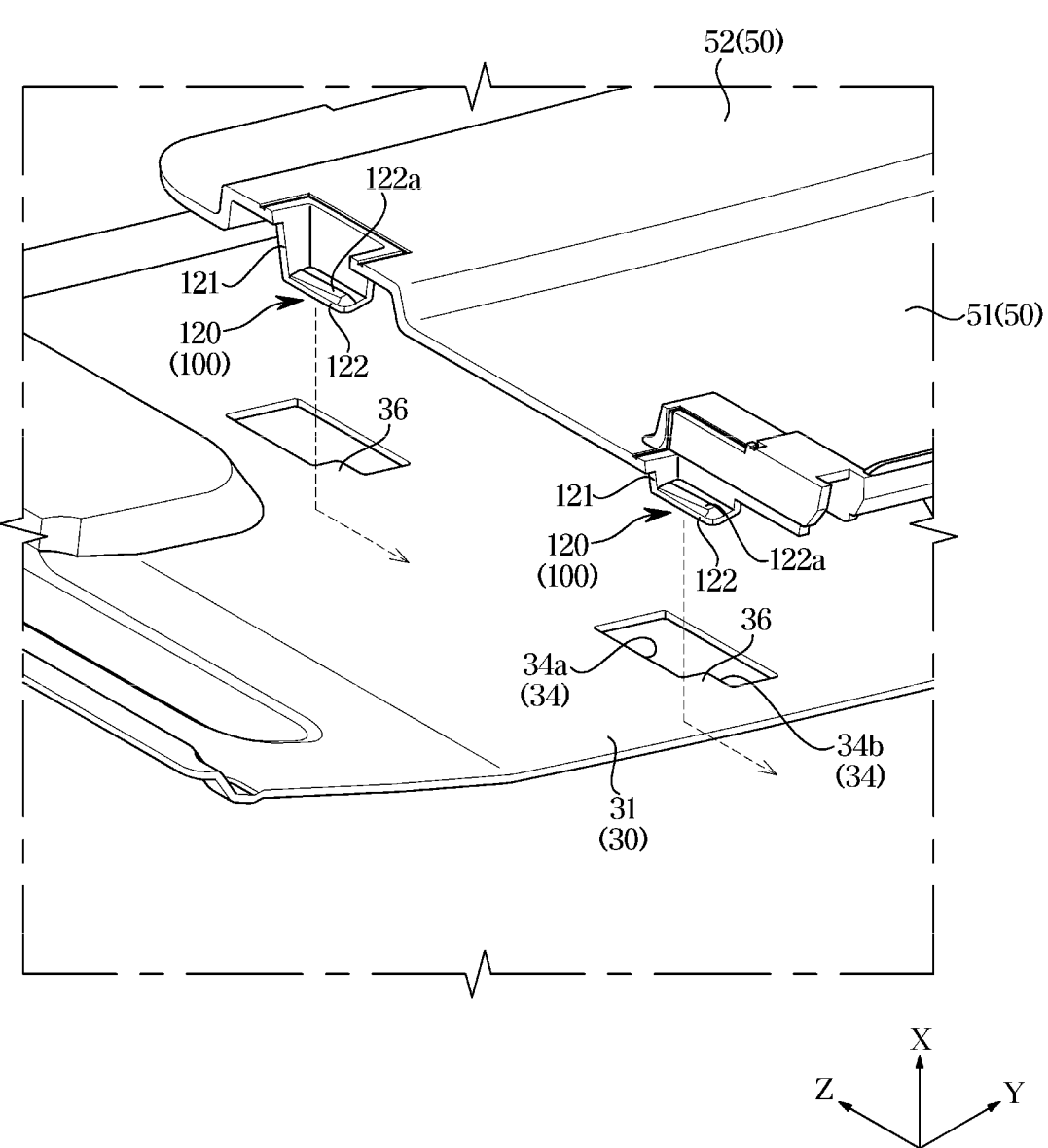
FIG. 6 is an enlarged view of the display apparatus according to an embodiment of the disclosure.

FIG. 5 is an enlarged view of the display apparatus according to an embodiment. FIG. 6 is an enlarged view of the display apparatus according to an embodiment. FIG. 5 is an enlarged view of A in the display apparatus shown in FIG. 3, illustrating a process in which the coupling portion formed on the inner plate is inserted into the coupling portion formed on the support plate. Further, FIG. 5 is a cross-sectional perspective view of the display apparatus shown in FIG. 3. FIG. 6 is an enlarged view of B in the display apparatus shown in FIG. 3, illustrating a process in which the coupling portion formed on the inner plate is inserted into the coupling portion formed on the support plate.

Referring to FIGS. 5 and 6, the display apparatus according to an embodiment may include the inner plate 50 and the support plate 30. The inner plate 50 may be mounted on the support plate 30, and for this, the inner plate 50 and the support plate 30 may include the coupling portions 32 and 100.

The coupling portions 32 and 100 may include the hook 100 and the insertion hole 32. The hook 100 may be formed on the inner plate 50. The hook 100 may protrude from the plate portions 51 and 52 of the inner plate 50 toward the support plate 30. For example, the hook 100 may protrude rearward from the plate portions 51 and 52. The insertion hole 32 may be formed to penetrate the support base 31 of the support plate 30.

The hook 100 may include the central hook 110 provided to protrude from the center of the inner plate 50 and inserted into the first insertion hole 33. For example, while the inner plate 50 is being mounted on the support plate 30, the central hook 110 may be moved from the front to the rear and inserted into the first insertion hole 33. The central hook 110 may be inserted into a first portion 33a of the first insertion hole 33.

The central hook 110 may include a protrusion 111 and a stopper 112. The protrusion 111 may protrude rearward. For example, the inner plate 50 may include a stepped portion 110a having a step difference from the plate portions 51 and 52 to the front side, and the protrusion 111 may extend rearward from the stepped portion 110a. The protrusion 111 may protrude from both sides of the stepped portion 110a. For example, a plurality of protrusions 111 may be provided.

The stopper 112 may be formed at one end of the protrusion 111. For example, the stopper 112 may be provided at the rear end of the protrusion 111 and may be in contact with a contact protrusion 35 of the support plate 30 (refer to FIG. 9). While the inner plate 50 is being mounted on the support plate 30, a front surface 112a of the stopper 112 of the central hook 110 may be in contact with a rear surface 35a of the contact protrusion 35. A plurality of stoppers 112 may be provided. The contact protrusion 35 may have a number, shape and/or location corresponding to the stopper 112.

The insertion hole 32 may be formed at a position corresponding to the hook 100. For example, the insertion hole 32 may include the first insertion hole 33 corresponding to the central hook 110. The first insertion hole 33 may be formed at the lower center side of the support plate 30. The first insertion hole 33 may include the first portion 33a and a second portion 33b. The first portion 33a may have a larger cross-sectional area than the second portion 33b. For example, while the inner plate 50 is being mounted on the support plate 30, the central hook 110 may be inserted into the first portion 33a of the first insertion hole 33.

The support plate 30 may include the contact protrusion 35. The contact protrusion 35 may protrude rearward from the support base 31. The contact protrusion 35 may be formed adjacent to the second portion 33b of the first insertion hole 33. The contact protrusion 35 may be in contact with the stopper 112 of the central hook 110. The contact protrusion 35 may have a number, shape, and/or location corresponding to the stopper 112. A plurality of contact protrusions 35 may be provided.

The hook 100 may include the side hook 120 provided to protrude from both ends of the inner plate 50 and to be inserted into the second insertion hole 34. For example, while the inner plate 50 is being mounted on the support plate 30, the side hook 120 may be moved from the front to the rear and inserted into the second insertion hole 34. The side hook 120 may be inserted into a first portion 34a of the second insertion hole 34.

A plurality of side hooks 120 may be provided. For example, the side hook 120 may be formed at both ends of the inner plate 50 extending in the left and right directions. For example, the side hook 120 may protrude from both ends of the inner plate 50 that is each of the first plate portion 51 and the second plate portion 52.

The side hook 120 may include a protrusion 121 and a stopper 122. The protrusion 121 may protrude rearward. For example, the protrusion 121 may extend rearward from the plate portions 51 and 52. The stopper 122 may be formed at one end of the protrusion 121. For example, the stopper 122 may be provided at the rear end of the protrusion 121 and may be in contact with the contact protrusion 35 of the support plate 30 (refer to FIG. 10). The stopper 122 of the side hook 120 may extend in the vertical direction. While the inner plate 50 is mounted on the support plate 30, a front surface 122a of the stopper 122 of the side hook 120 may be in contact with a rear surface 36a of an inner protrusion 36 (refer to FIG. 10).

The insertion hole 32 may be formed at a position corresponding to the hook 100. For example, the insertion hole 32 may include the second insertion hole 34 corresponding to the side hook 120. The second insertion holes 34 may be formed on both sides of the lower portion of the support plate 30. The second insertion hole 34 may include the first portion 34a and a second portion 34b. The first portion 34a may have a larger cross-sectional area than the second portion 34b. For example, while the inner plate 50 is mounted on the support plate 30, the side hook 120 may be inserted into the first portion 34a of the second insertion hole 34.

The support plate 30 may include the inner protrusion 36. The inner protrusion 36 may protrude from the support base 31 toward the second insertion hole 34. The inner protrusion 36 may be formed adjacent to the second portion of the second insertion hole 34. The inner protrusion 36 may be in contact with the stopper 122 of the side hook 120. The inner protrusion 36 may have a number, shape, and/or location corresponding to the stopper 122. A plurality of inner protrusions 36 may be provided.

Figure 7:
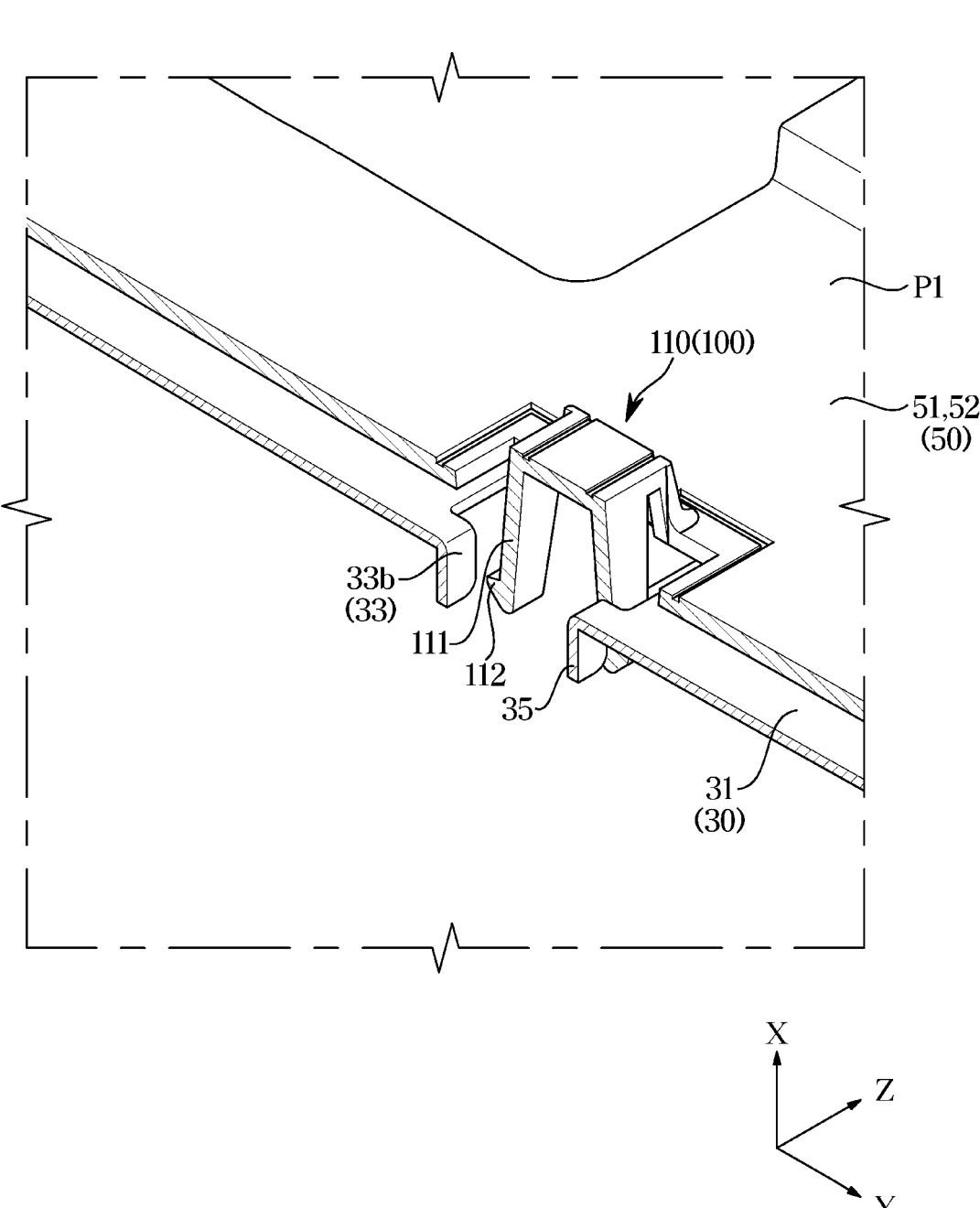
FIG. 7 is an enlarged view of the display apparatus according to an embodiment of the disclosure.
Figure 8:
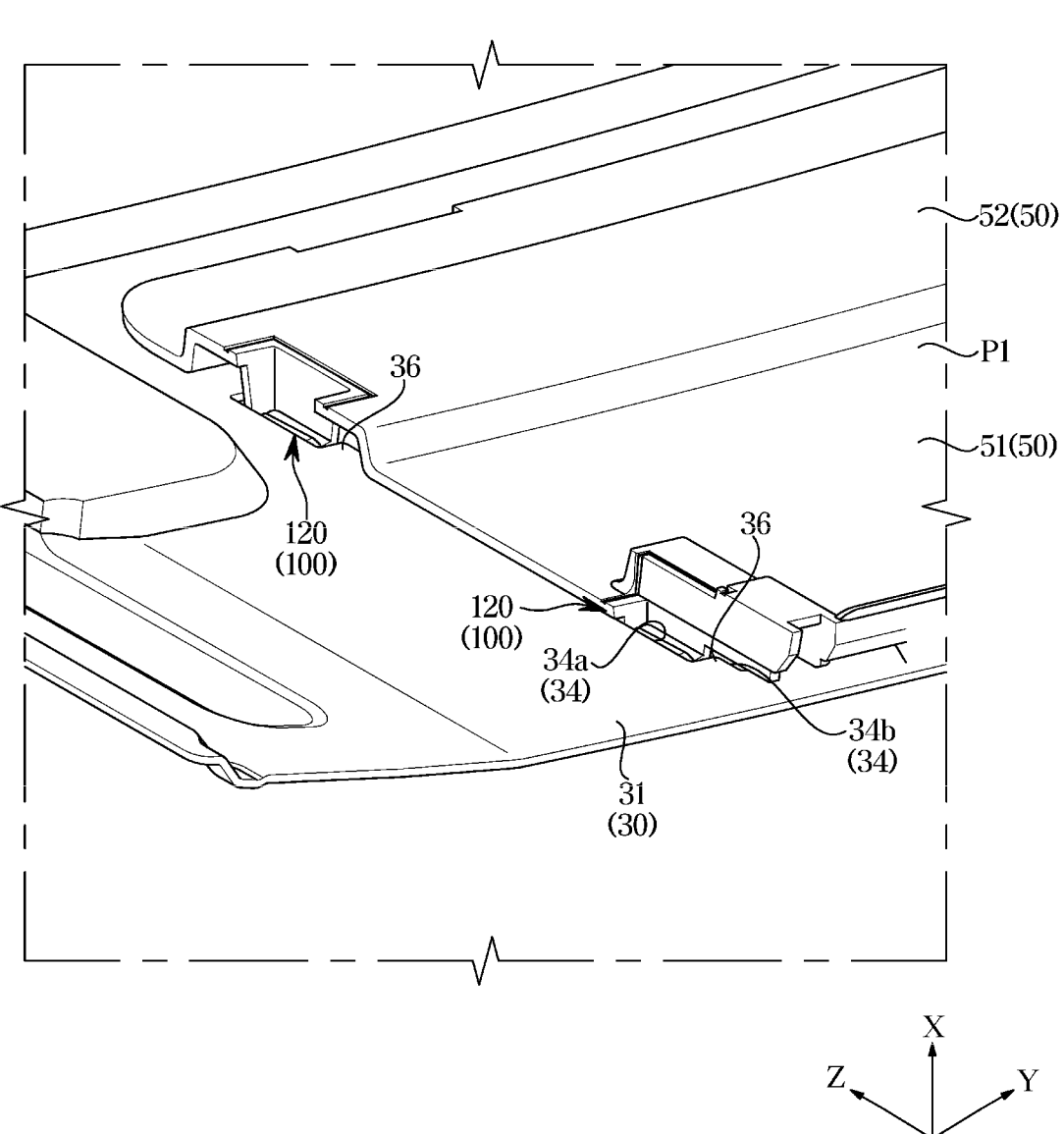
FIG. 8 is an enlarged view of the display apparatus according to an embodiment of the disclosure.

FIG. 7 is an enlarged view of the display apparatus according to an embodiment. FIG. 8 is an enlarged view of the display apparatus according to an embodiment. FIG. 7 illustrates that the coupling portion formed on the inner plate is inserted into the coupling portion formed on the support plate in the display apparatus shown in FIG. 5. FIG. 8 illustrates that the coupling portion formed on the inner plate is inserted into the coupling portion formed on the support plate in the display apparatus shown in FIG. 6.

Referring to FIGS. 7 and 8, in the display apparatus according to an embodiment, the hook 100 of the inner plate 50 may be inserted into the insertion hole 32 of the support plate 30, and the hook 100 may pass through the insertion hole 32. For example, the hook 100 may be located in the first portions 33a and 34a of the insertion hole 32. While the hook 100 is being inserted into the first portions 33a and 34a of the insertion hole 32, the inner plate 50 may be positioned at a first position P1.

The inner plate 50 may slide from the first position P1 to a second position P2. For example, the inner plate 50 may slide downward and then be completely mounted on the support plate 30.

Figure 9:
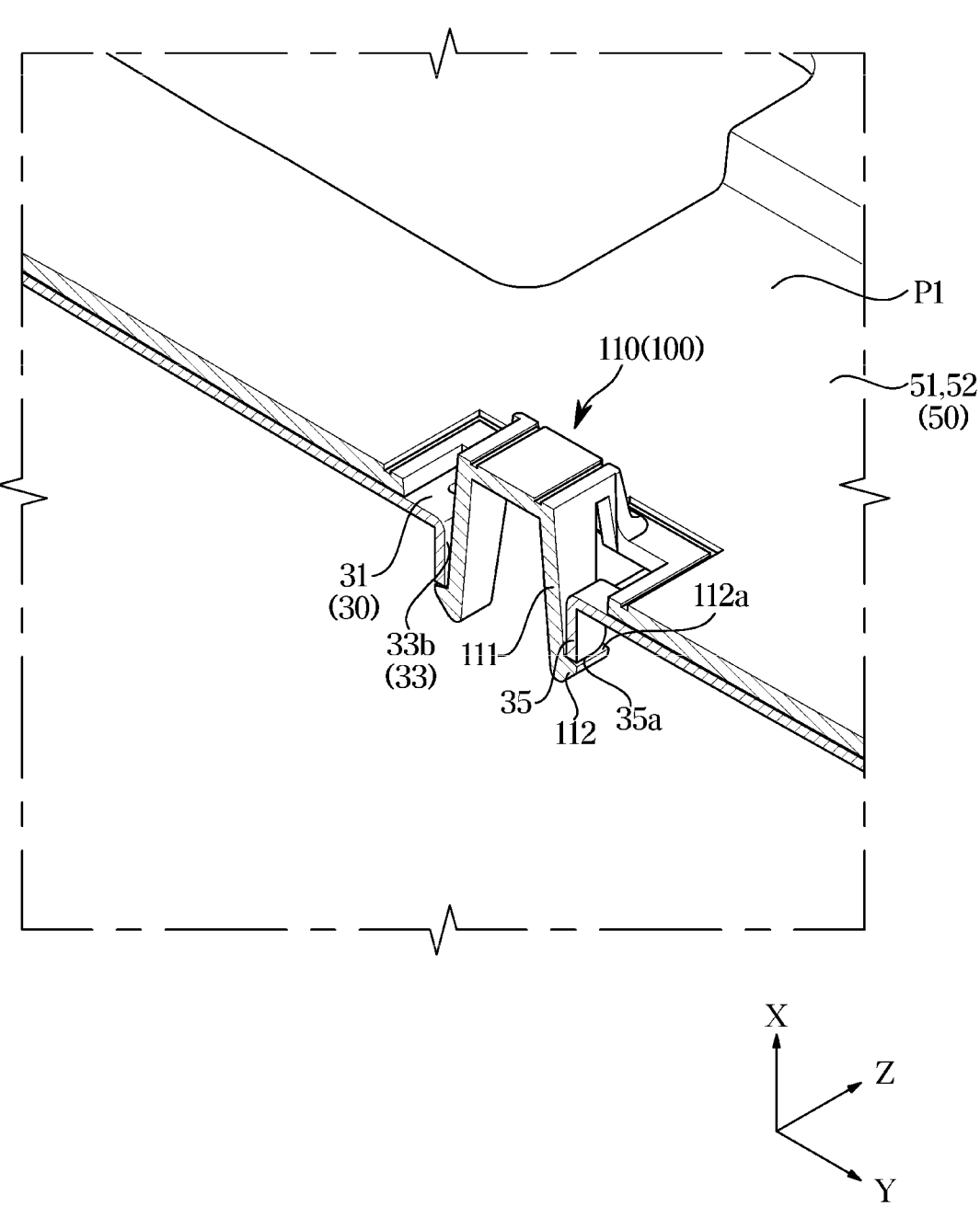
FIG. 9 is an enlarged view of the display apparatus according to an embodiment of the disclosure.
Figure 10:
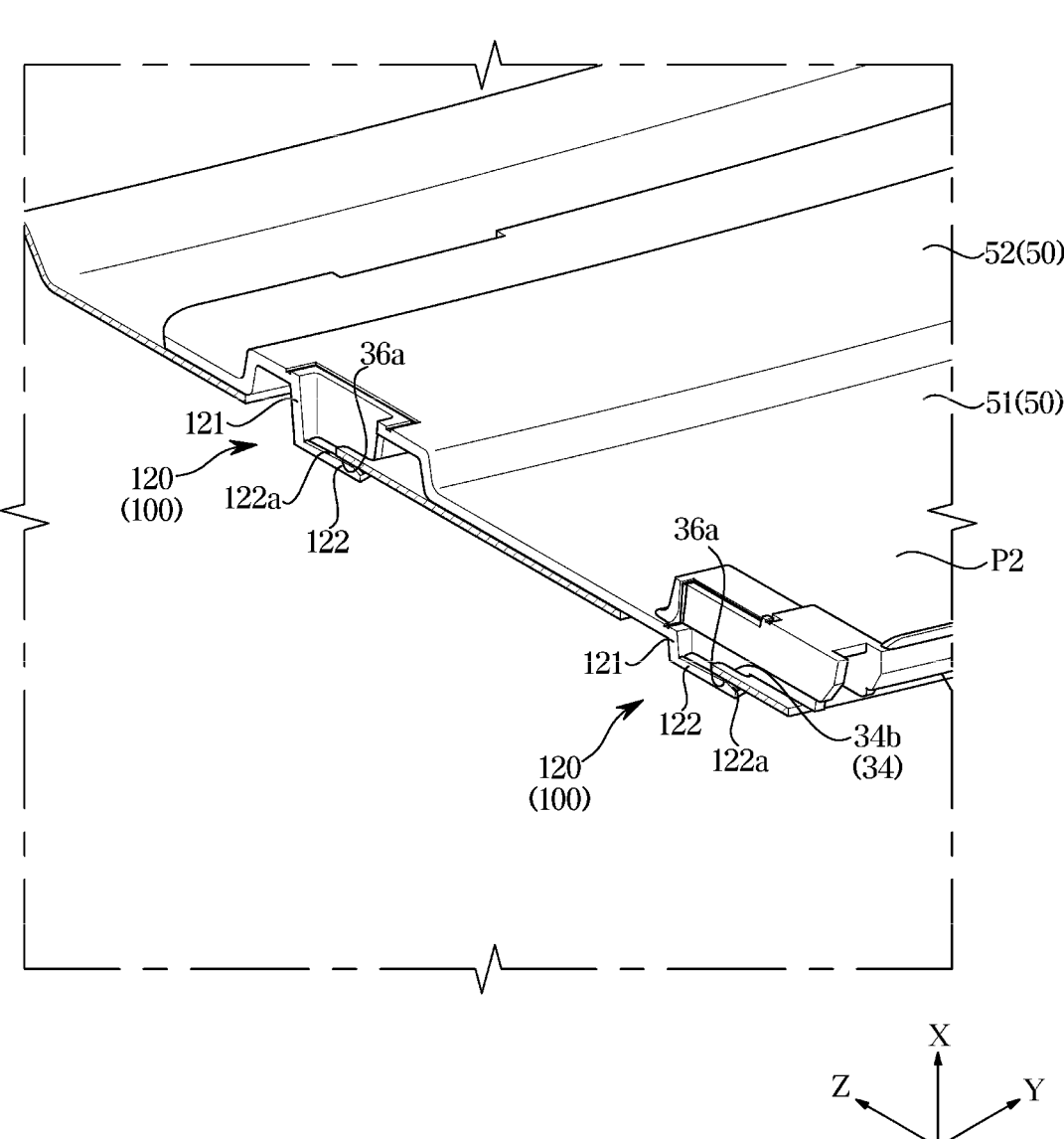
FIG. 10 is an enlarged view of the display apparatus according to an embodiment of the disclosure.

FIG. 9 is an enlarged view of the display apparatus according to an embodiment. FIG. 10 is an enlarged view of the display apparatus according to an embodiment. FIG. 9 illustrates that in the display apparatus shown in FIG. 7, the coupling portion formed on the inner plate slides on the coupling portion formed on the support plate. FIG. 10 illustrates that in the display apparatus shown in FIG. 8, the coupling portion formed on the inner plate slides on the coupling portion formed on the support plate. Further, FIG. 10 is a cross-sectional perspective view of the display apparatus shown in FIG. 8.

Referring to FIGS. 9 and 10, in the display apparatus according to an embodiment, as the hook 100 of the inner plate 50 slides in the insertion hole 32 of the support plate 30, the hook 100 may be mounted on the insertion hole 32. For example, the hook 100 may be located in the second portions 33b and 34b of the insertion hole 32. While the hook 100 is being mounted on the protrusions 35 and 36 by the second portions 33b and 34b of the insertion hole 32, the inner plate 50 may be positioned at the second position P2.

The inner plate 50 may slide downward and then be completely mounted on the support plate 30. While the inner plate 50 is being mounted on the support plate 30, the front surface 112a of the stopper 112 of the central hook 110 may be in contact with the rear surface 35a of the contact protrusion 35. Further, the front surface 122a of the stopper 122 of the side hook 120 may be in contact with the rear surface 36a of the inner protrusion 36. The front surface 122a of the stopper 122 may protrude forward. Because the display panel 10 has a curvature, the display panel 10 has the tendency to return to a flat shape. However, even when the inner plate 50, to which the display panel 10 is attached, is mounted to the support plate 30, the inner plate 50 may be stably fixed without shake due to the above-described structure.

Figure 11:
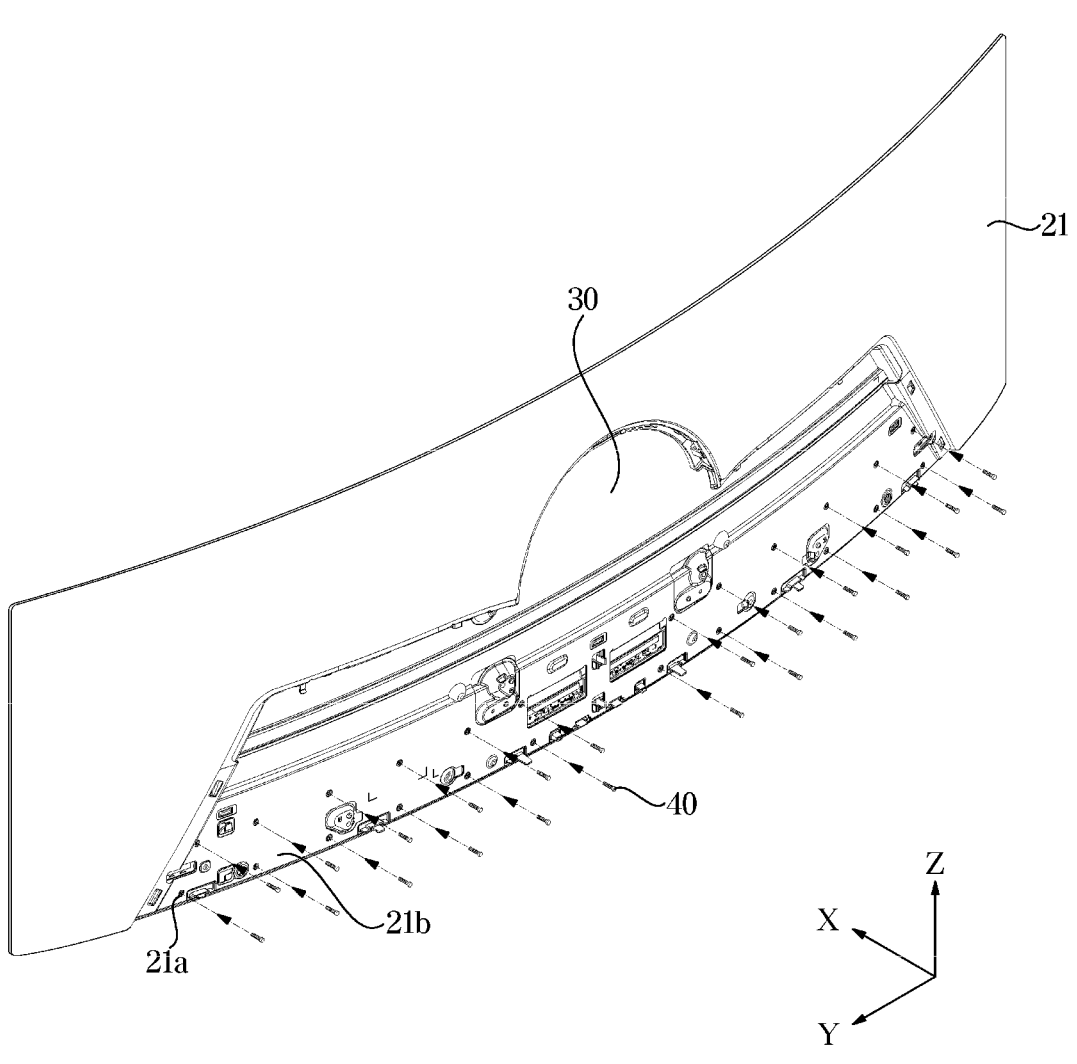
FIG. 11 is a perspective view of the display apparatus according to an embodiment of the disclosure.

FIG. 11 is a perspective view of the display apparatus according to an embodiment. FIG. 11 is a rear perspective view of the display apparatus.

Referring to FIG. 11, in the display apparatus according to an embodiment, after the inner plate 50 is mounted on the support plate 30 through the process of FIGS. 6 to 10, the first cover 21, the support plate 30 and the inner plate 50 may be screwed together via the fastening member 40. For example, the fastening member 40 may be inserted into the first cover 21, the support plate 30, and the inner plate 50 from the rear to the front. For example, the fastening member 40 may pass through the second cover mounting portion 21b of the first cover 21 and fasten the first cover 21, the support plate 30, and the inner plate 50. Accordingly, the first cover 21 may be coupled to the support plate 30 and the inner plate 50. Thereafter, the second cover 22 may be mounted on the first cover mounting portion, and the fastening member 40 and the fastening hole 21a may be covered by the second cover 22.

Figure 12:
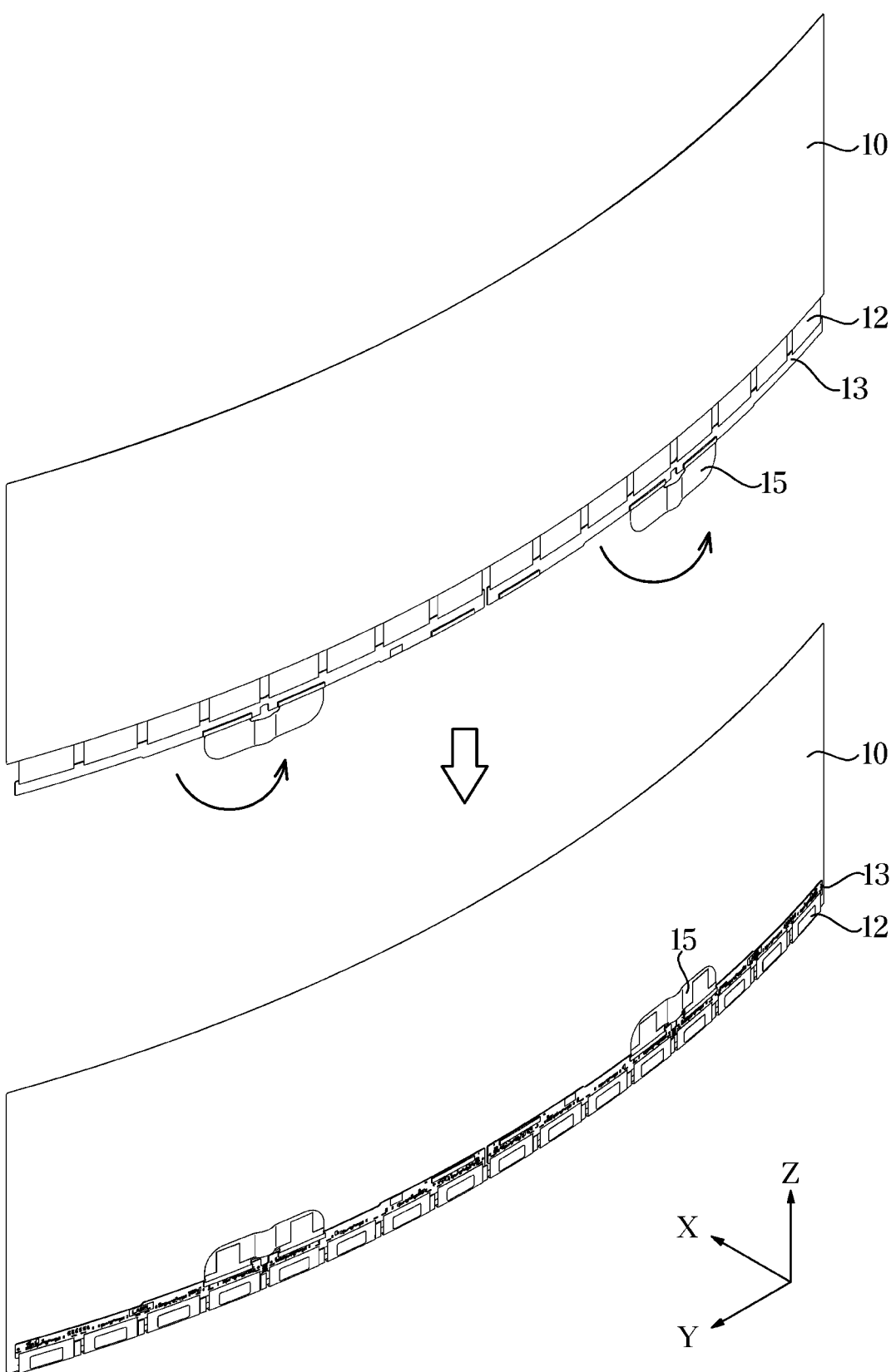
FIG. 12 is a perspective view of a display panel of the display apparatus according to an embodiment of the disclosure.

FIG. 12 is a perspective view of the display panel in the display apparatus according to an embodiment. FIG. 12 is a rear perspective view of the display panel.

Referring to FIG. 12, the film cable 12 may be connected to the lower end of the display panel 10. The film cable 12 may be connected to the self-luminous panel 11 at a first end and connected to the control board 13 at a second end. For example, the first and second ends of the film cable may be both ends along the vertical direction. Further, the connection cable 15 may electrically connect adjacent control boards 13 to each other.

The display apparatus according to an embodiment may attach the film cable 12, the control board 13, and the connection cable to the rear surface of the display panel 10. For example, the film cable 12, the control board 13, and the connection cable may be attached to the rear surface of the display panel 10 by an adhesive member such as adhesive or double-sided tape.

Although it is illustrated that the display panel 10 has a curvature in the drawings, the display panel 10 before being fixed, bonded, and/or attached to the inner plate 50 and the support plate 30 may not have a curvature.

Figure 13:
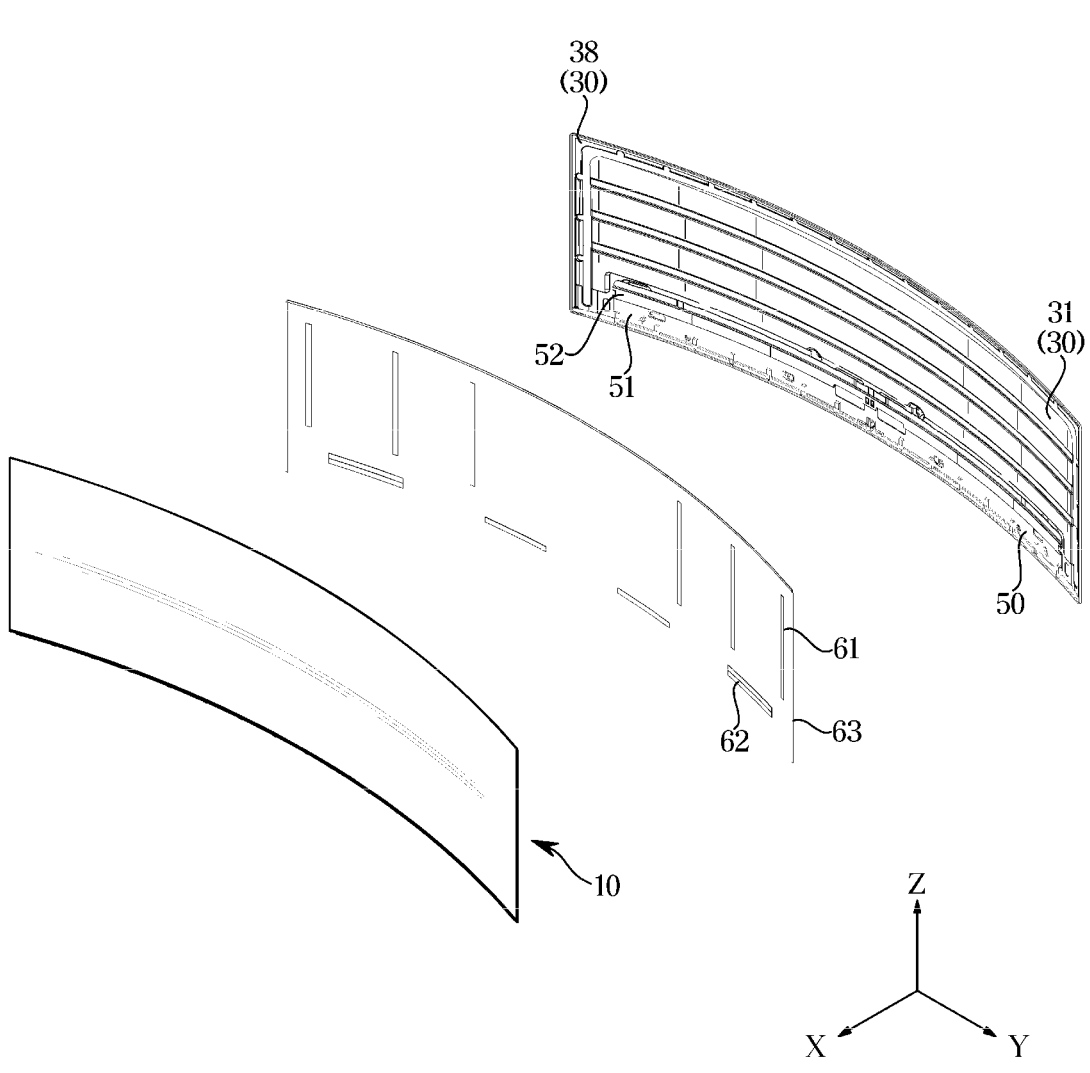
FIG. 13 is an exploded-perspective view of the display apparatus according to an embodiment of the disclosure.

FIG. 13 is an exploded perspective view of the display apparatus according to an embodiment. FIG. 13 is a front perspective view illustrating the display panel, the adhesive member, the inner plate, and the support plate.

Referring to FIG. 13, in the display apparatus according to an embodiment, the display panel 10, the inner plate 50, and the support plate 30 may be attached to each other through the adhesive member 60. For example, the display panel 10 may be fixed to the inner plate 50 and the support plate 30 through the adhesive member 60.

The first adhesive member 61 may extend in the vertical direction and allow the central portion and upper portion of the display panel 10 to be fixed and/or attached to the support plate 30.

The second adhesive member 62 may be located below the first adhesive member 61. The second adhesive member may extend in the left and right directions and allow the lower part of the display panel 10 to be fixed and/or attached to the inner plate 50.

The third adhesive member 63 may allow the edge of the display panel 10 and the edge portion 38 of the support plate 30 to be attached in the edge portion 38 of the support plate 30.

For example, as the display panel 10 is attached to the inner plate 50 and the support plate 30, the display panel 10 may have a curvature.

According to an embodiment, through the above process, the inner plate 50 may be easily mounted on the support plate 30, and the display panel 10 may be attached to the support plate 30 and the inner plate 50 by the adhesive member 60. Accordingly, it is possible to simplify the manufacturing process and thus it is possible to increase the manufacturing efficiency of the display apparatus.

Hereinafter a process in which the display panel 10 is separated from the inner plate 50 and the support plate 30, or the adhesive member 60 is peeled off between the display panel 10, and the inner plate 50 and the support plate 30, and the inner plate 50 is removed and/or separated from the support plate 30 will be described.

Figure 14:
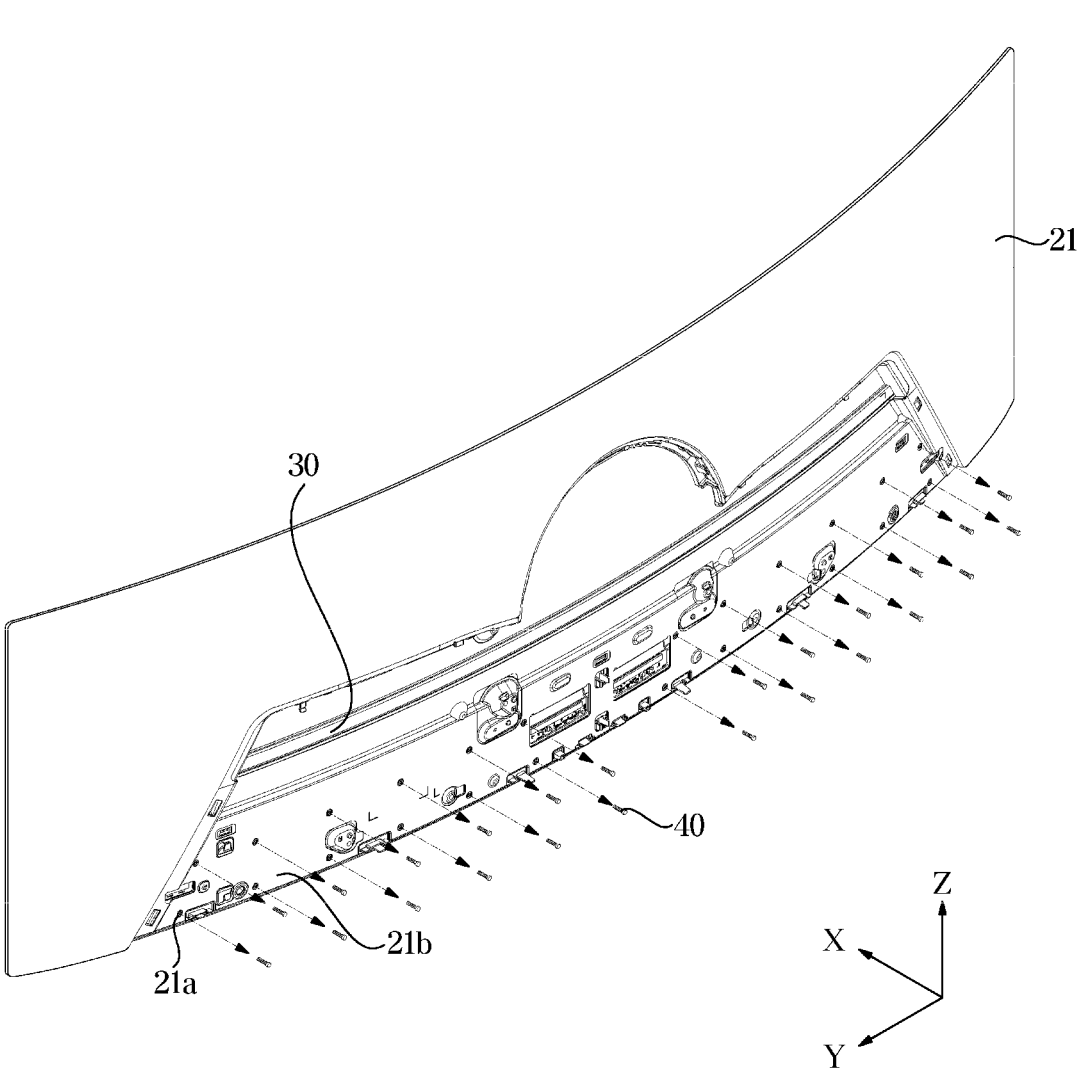
FIG. 14 is a perspective view of the display apparatus according to an embodiment of the disclosure.

FIG. 14 is a perspective view of the display apparatus according to an embodiment. FIG. 14 is a rear perspective view of the display apparatus.

Referring to FIG. 14, in the display apparatus according to an embodiment, the display panel 10 may be attached to the inner plate 50 and the support plate 30 through the adhesive member 60. The first cover 21, the support plate 30 and the inner plate 50 may be screwed through the fastening member 40. At this time, the fastening member 40 may be separated from the front to the rear to separate the first cover 21, the support plate 30, and the inner plate 50 from each other. For example, the fastening member 40 may be separated from the fastening hole 21*a*. Accordingly, the first cover 21 may be separated from the support plate 30 and the inner plate 50.

Figure 15:
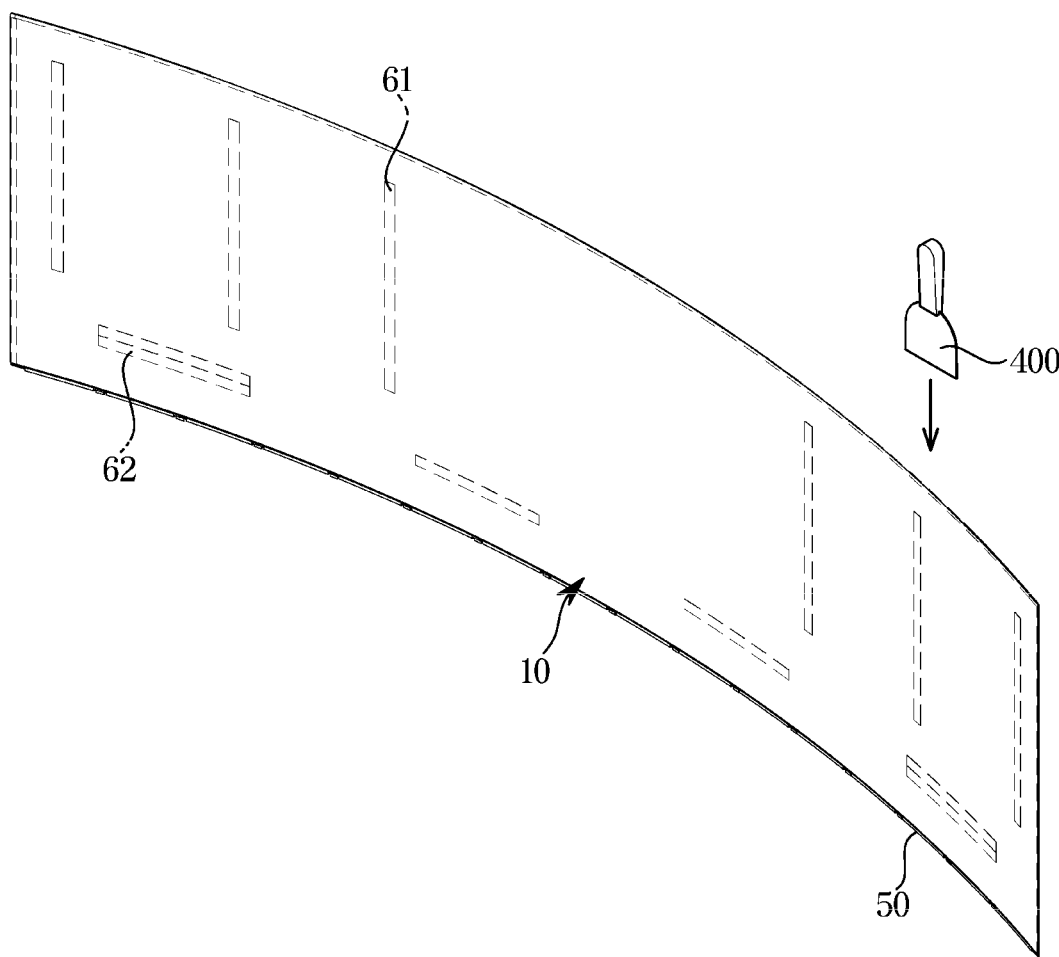
FIG. 15 is a perspective view of the display apparatus according to an embodiment of the disclosure.

FIG. 15 is a perspective view of the display apparatus according to an embodiment. FIG. 15 is a front perspective view of the display apparatus, illustrating a state in which the display panel, the inner plate, and the support plate are attached to each other through the adhesive member.

FIG. 15 illustrates that the inner plate 50 and the support plate 30 are covered by the display panel.

Referring to FIG. 15, in the display apparatus according to an embodiment, a peeler 400 (or separator) may be inserted between the display panel 10 and the support plate 30 in a state in which the fastening member 40 is separated from the first cover 21, the support plate 30 and the inner plate 50. For example, the peeler 400 may be inserted between the support plate 30 and the display panel 10 in a downward direction from the top of the display panel 10 and the support plate 30. A shape and insertion position of the peeler 400 are not limited to those shown in the drawings.

The first adhesive member 61 attaching the upper and middle portions of the display panel 10 and the support plate 30 may be peeled off by the peeler 400 while the peeler 400 is inserted between the display panel 10 and the support plate 30. Accordingly, the attachment of the display panel 10 and the support plate 30 may be released. However, the lower portion of the display panel 10 and the inner plate 50 attached by the second adhesive member 62 may not be separated by the peeler 400.

Figure 16:
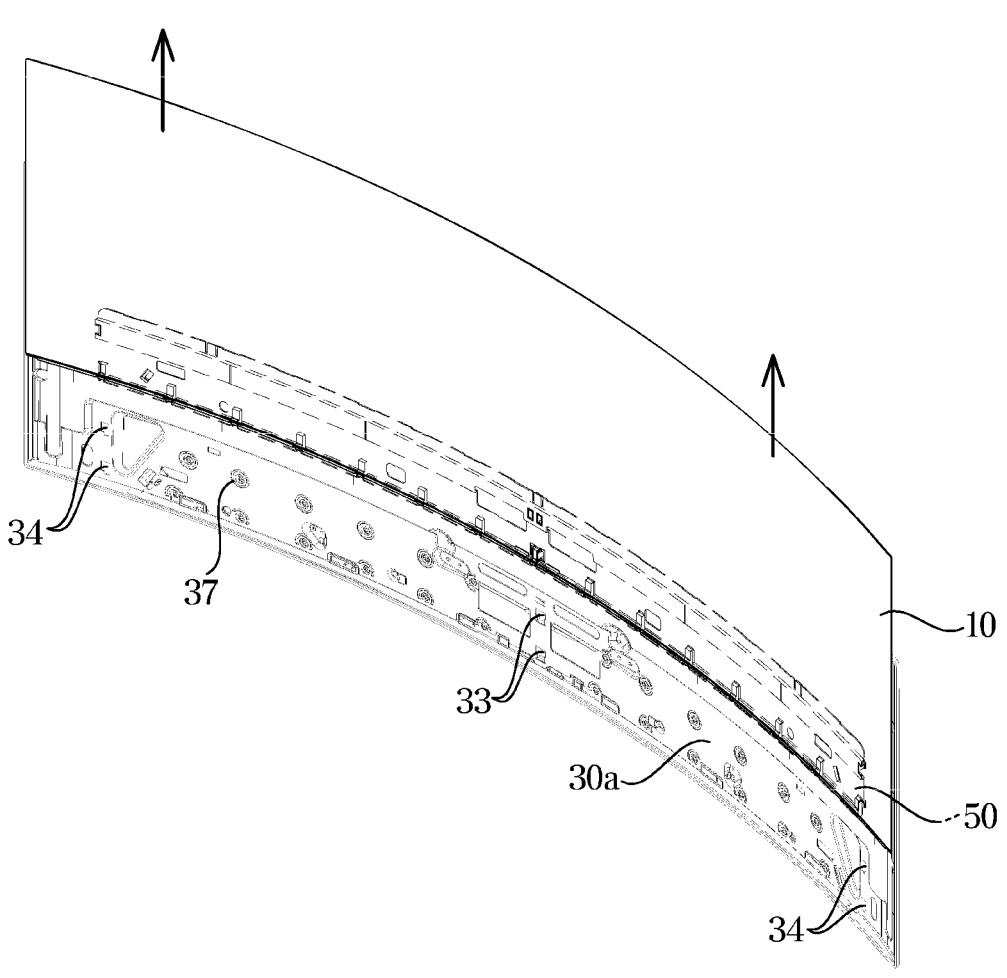
FIG. 16 is an exploded-perspective view of the display apparatus according to an embodiment of the disclosure.
Figure 16:
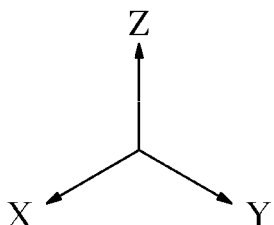
Figure 17:
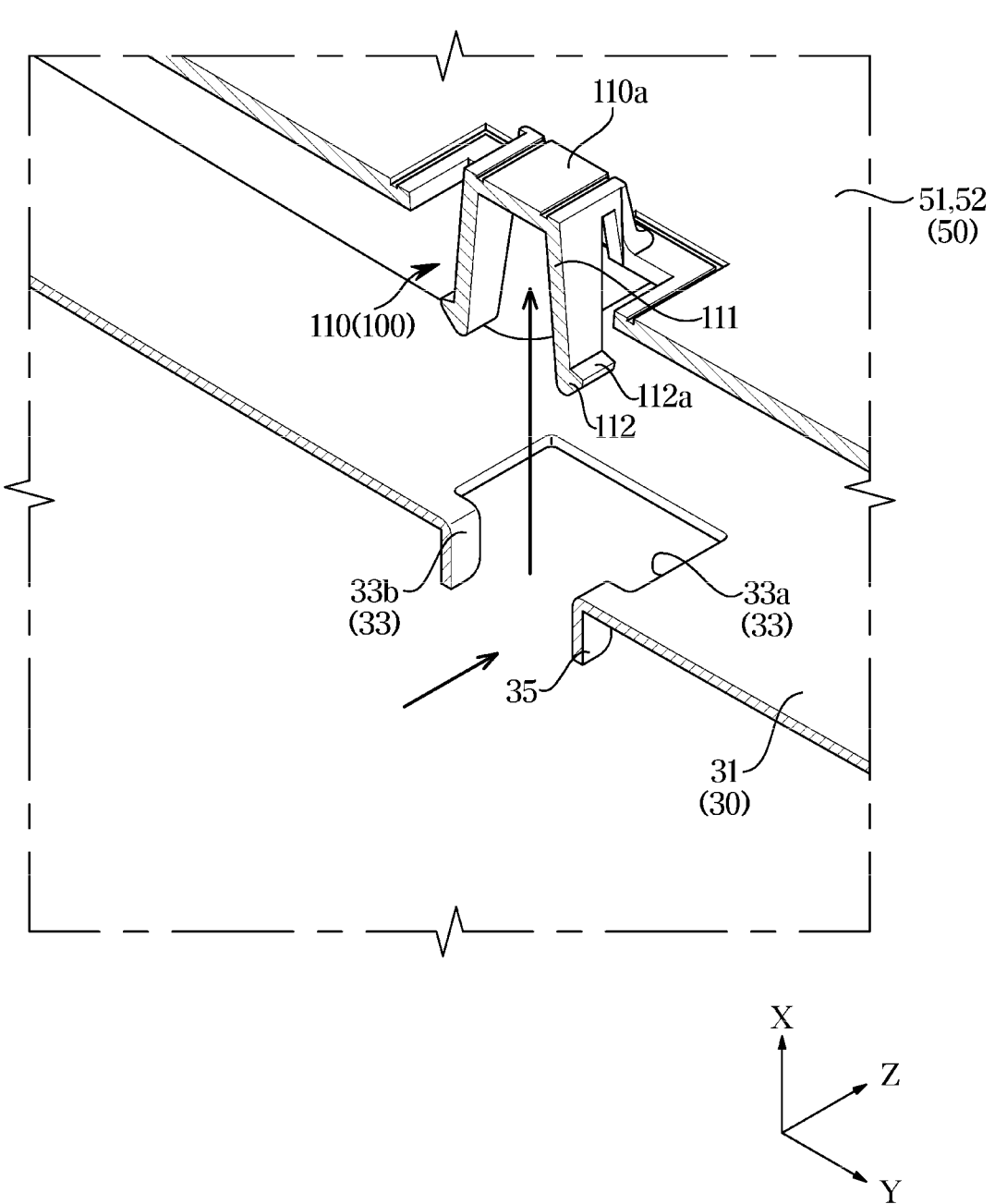
FIG. 17 is an enlarged view of the display apparatus according to an embodiment of the disclosure.
Figure 18:
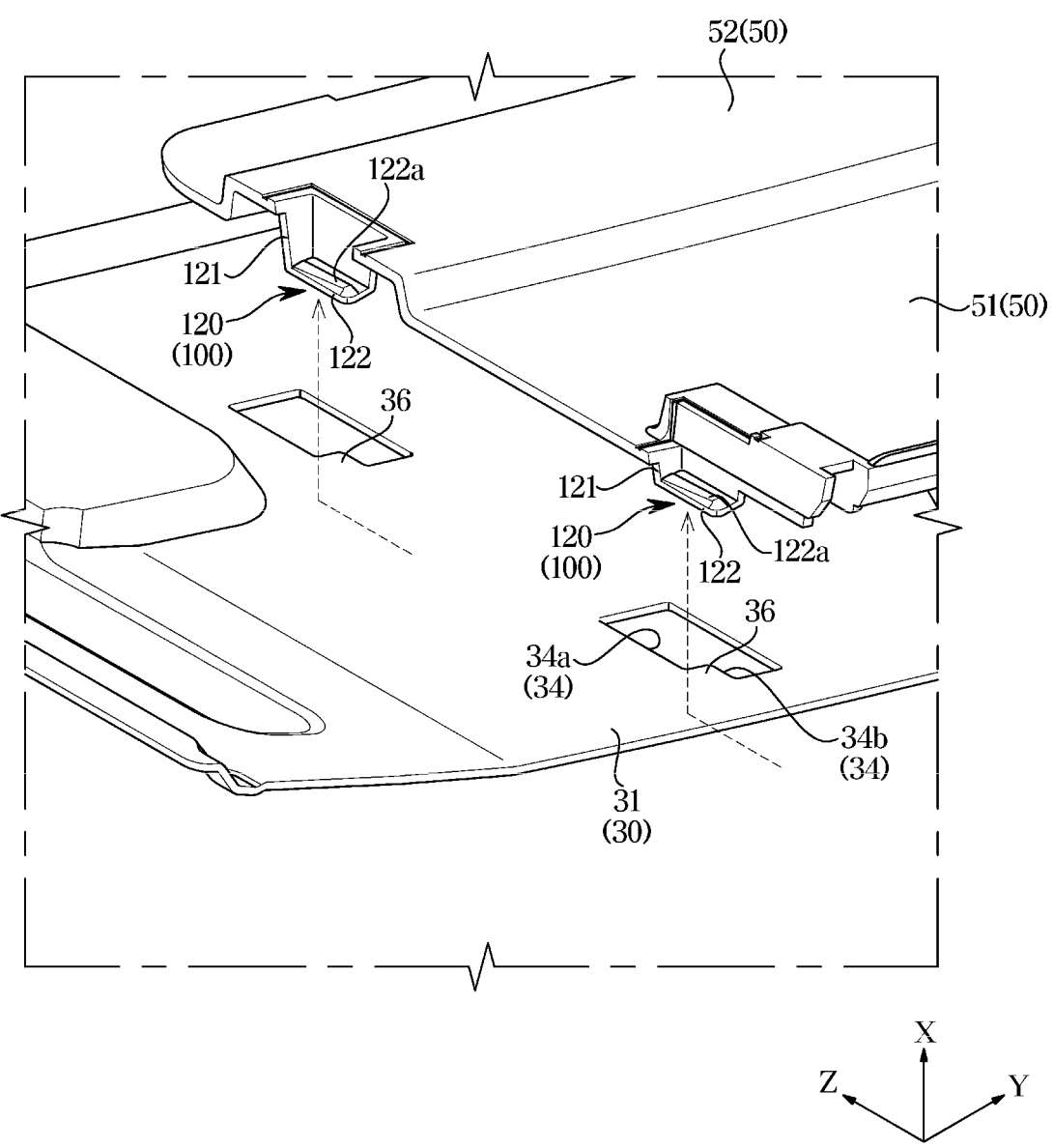
FIG. 18 is an enlarged view of the display apparatus according to an embodiment of the disclosure.
Figure 19:
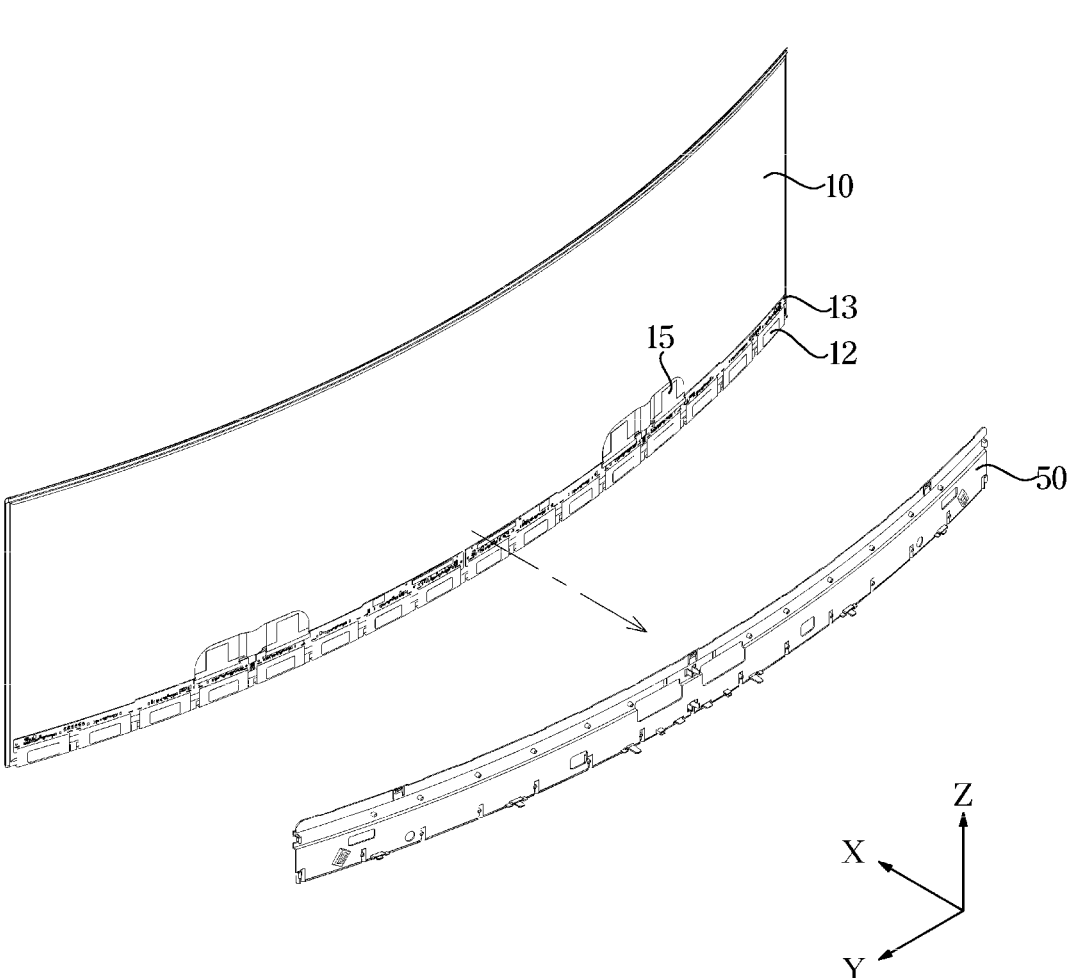
FIG. 19 is an exploded-perspective view of the display apparatus according to an embodiment of the disclosure.

FIG. 16 is an exploded-perspective view of the display apparatus according to an embodiment. FIG. 17 is an enlarged view of the display apparatus according to an embodiment. FIG. 18 is an enlarged view of the display apparatus according to an embodiment. FIG. 19 is an exploded-perspective view of the display apparatus according to an embodiment. FIG. 19 is a rear exploded-perspective view of the display apparatus, illustrating that the inner plate is separated from the display panel.

Referring to FIGS. 16 to 19, the display panel 10 to which the inner plate 50 is attached may be separated from the support plate 30. For example, because the first adhesive member 61 is removed by the peeler 400, the display panel 10 and the inner plate 50 may be attached by the second adhesive member 62, and thus the inner plate 50 may slide upward from the support plate 30 and then be separated from the support plate 30.

While the inner plate 50 is being separated from the support plate 30, the hook 100 may be moved from the second portions 33*b* and 34*b* to the first portions 33*a* and 34*a* of the insertion hole 32, and moved forward and then separated from the first portions 33*a* and 34*a*.

For example, in a state in which the stoppers 112 and 122 and the protrusions 35 and 36 are in contact with each other, the inner plate 50 may be moved from the second position P2 to the first position P1 to release the contact. For example, the inner plate 50 may be moved upward. Thereafter, the inner plate 50 moved to the first position P1 may be moved forward to allow the hook 100 to come out of the first portions 33*a* and 34*a* having the cross-sectional area greater than the cross-sectional area of the second portions 33*b* and 34*b*.

For example, as the inner plate 50 is moved from the second position P2 to the first position P1, the central hook 110 may be moved from the second portion 33*b* to the first portion 33*a* of the first insertion hole 33 and then the central hook 110 may come out of the first portion 33*a* having the cross-sectional area greater than the cross-sectional area of the second portion 33*b* of the first insertion hole 33.

Further, as the inner plate 50 is moved from the second position P2 to the first position P1, the side hook 120 may be moved from the second portion 34*b* to the first portion 34*a* of the second insertion hole 34 and then the side hook 120 may come out of the first portion 34*a* having the cross-sectional area greater than the cross-sectional area of the second portion 34*b* of the second insertion hole 34.

Through the above process, the display panel 10 to which the inner plate 50 is attached may be separated from the support plate 30. Because the control board 13 is attached to the display panel 10 and the rear side of the control board 13 is covered by the inner plate 50, the control board 13 may not be damaged even while the inner plate 50 is being separated from the support plate 30.

Referring to FIG. 19, the display panel 10 and the inner plate 50, which are separated from the support plate 30, may be separated from each other. For example, the second adhesive member 62 attaching the inner plate to the display panel 10 may be peeled off through an additional process. At this time, the control board 13 may not be damaged.

When the defect of the component of the display apparatus occurs or when after-sales service is required, the display apparatus needs to be separated. Through the above separation process of the display panel 10 and the control board 13, it is possible to separate the control board 13 without damage to the control board 13, and it is possible to replace only the defective components and to recycle and reuse the component that does not have the defect.

Therefore, even if a defect in the display apparatus is discovered during the manufacturing process, only the defective component needs to be replaced, and thus it is possible to reduce production and material costs. Further, even when a user requests after-sales service, it is possible to save the cost because only defective components need to be replaced.

Figure 20:
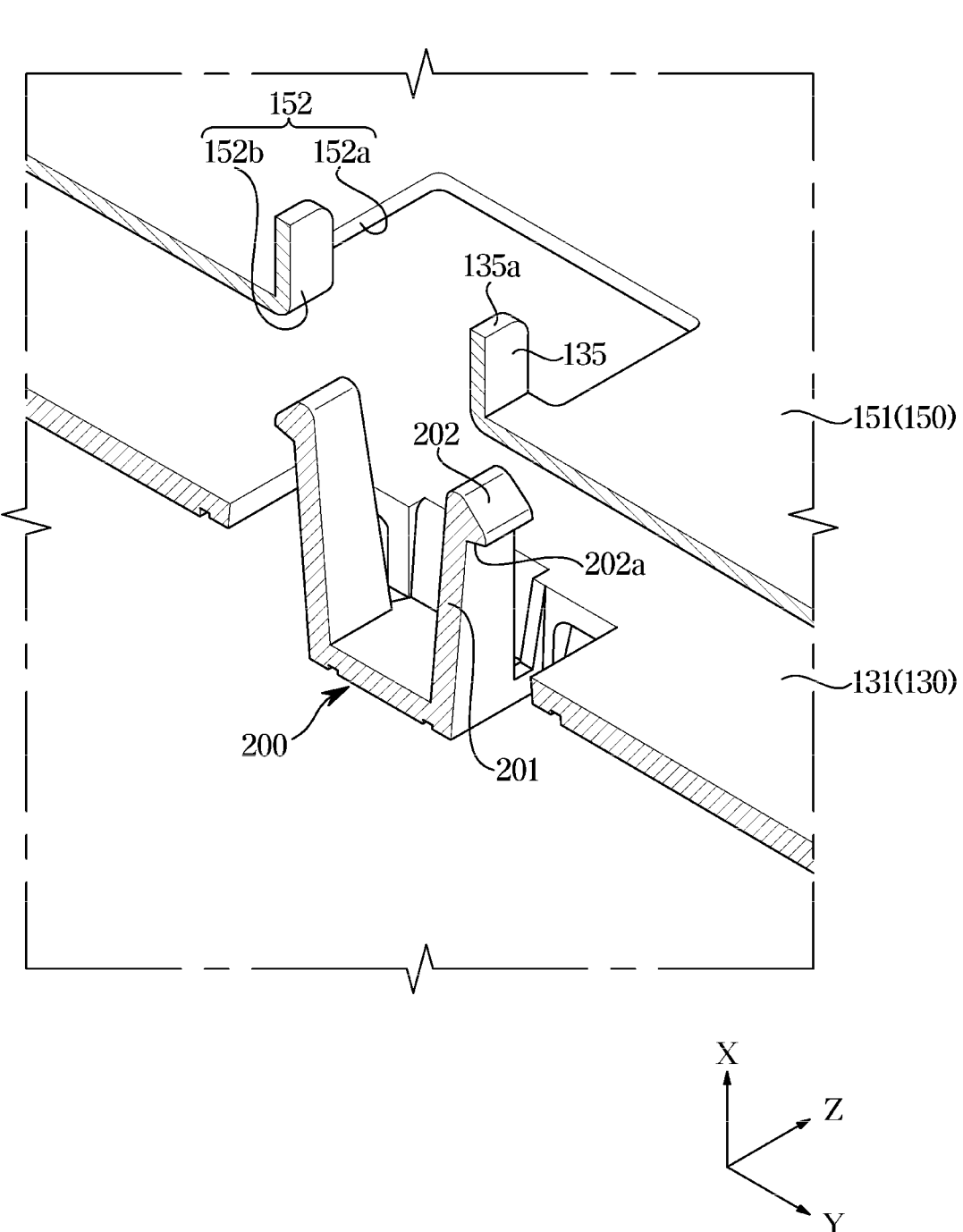
FIG. 20 is an exploded-perspective view of a display apparatus according to an embodiment of the disclosure.

FIG. 20 is an exploded-perspective view of a display apparatus according to an embodiment.

Referring to FIG. 20, a display apparatus according to an embodiment may include coupling portions 152 and 200 configured to mount, couple, and/or install an inner plate 150 to a support plate 130.

The coupling portions 152 and 200 may include an insertion hole 152 and a hook 200. The insertion hole 152 may be formed in the inner plate 150, and the hook 200 may be formed in the support plate 130.

For example, the hook 200 may protrude from the support plate 130 toward the inner plate 150 provided in the front. The hook 200 may include a protrusion 201 and a stopper 202.

The protrusion 201 may protrude forward. For example, the protrusion 201 may extend forward from a support base 131. The stopper 202 may be formed at one end of the protrusion 201. For example, the stopper 202 may be provided at a front end of the protrusion 201 and be in contact with a contact protrusion 135 of the inner plate 150. While the inner plate 150 is being mounted on the support plate 130, a rear surface 202*a* of the stopper 202 of the hook 200 may be in contact with a front surface 135*a* of the contact protrusion 135. Although only the central hook is shown in the drawing, the side hook may be also formed in a similar manner, and thus the inner plate 150 may be mounted on the support plate 130.

The inner plate 150 may include the insertion hole 152. The insertion hole 152 may be formed in a plate portion 151. The insertion hole 152 may accommodate the hook 200 formed on the support plate 130. The hook 200 may be inserted into a first portion 152*a* of the insertion hole 152 and slide. Accordingly, the stopper 202 of the hook 200 and the contact protrusion 135 may come into contact with each other in a second portion 152*b*.

The support plate 130 and the inner plate 150 may be slidably mounted and/or coupled to each other through the insertion hole 152 formed in the inner plate 150 and the hook 200 formed in the support plate 130.

Figure 21:
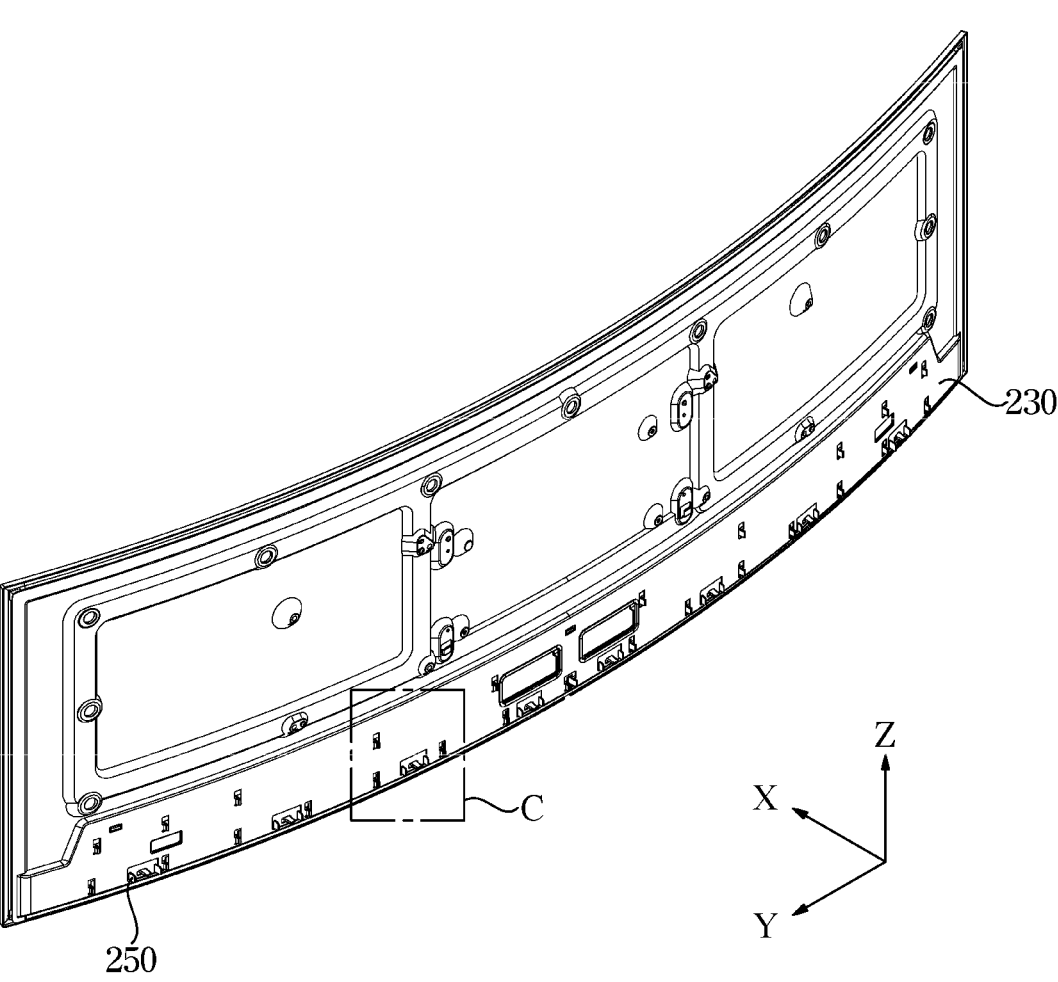
FIG. 21 is a perspective view of a display apparatus according to an embodiment of the disclosure.
Figure 22:
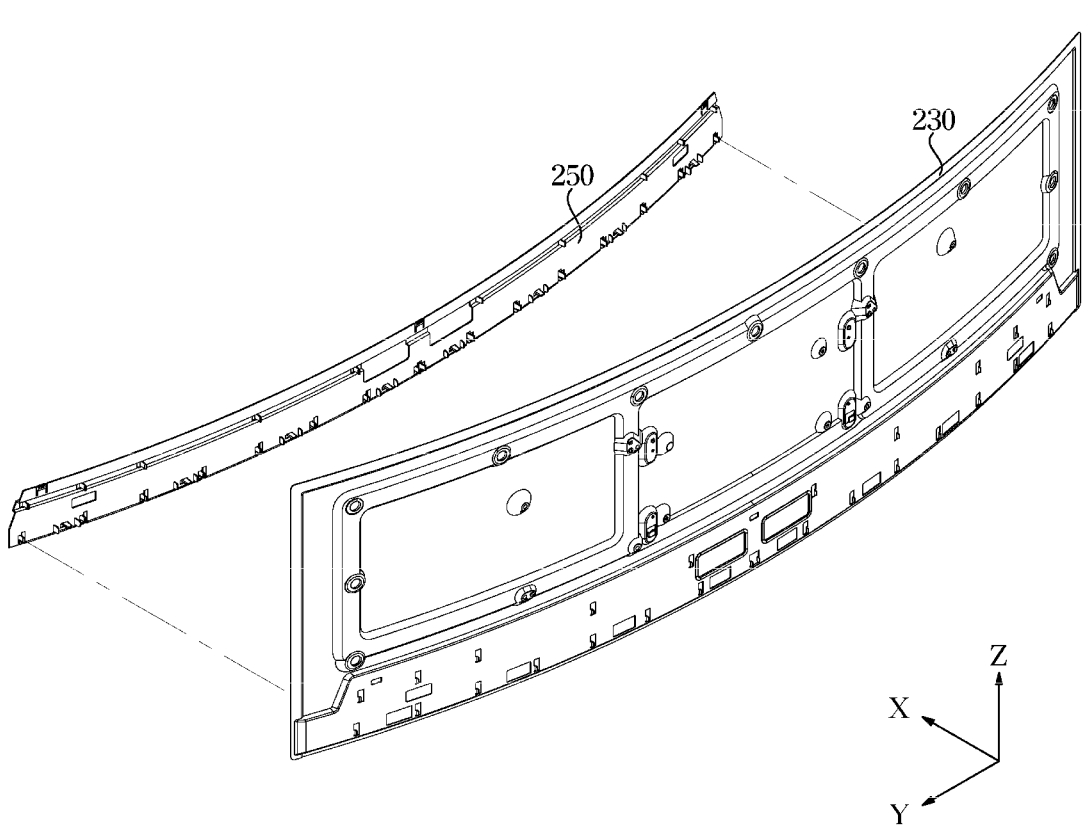
FIG. 22 is an exploded-perspective view of the display apparatus according to an embodiment of the disclosure.
Figure 23:
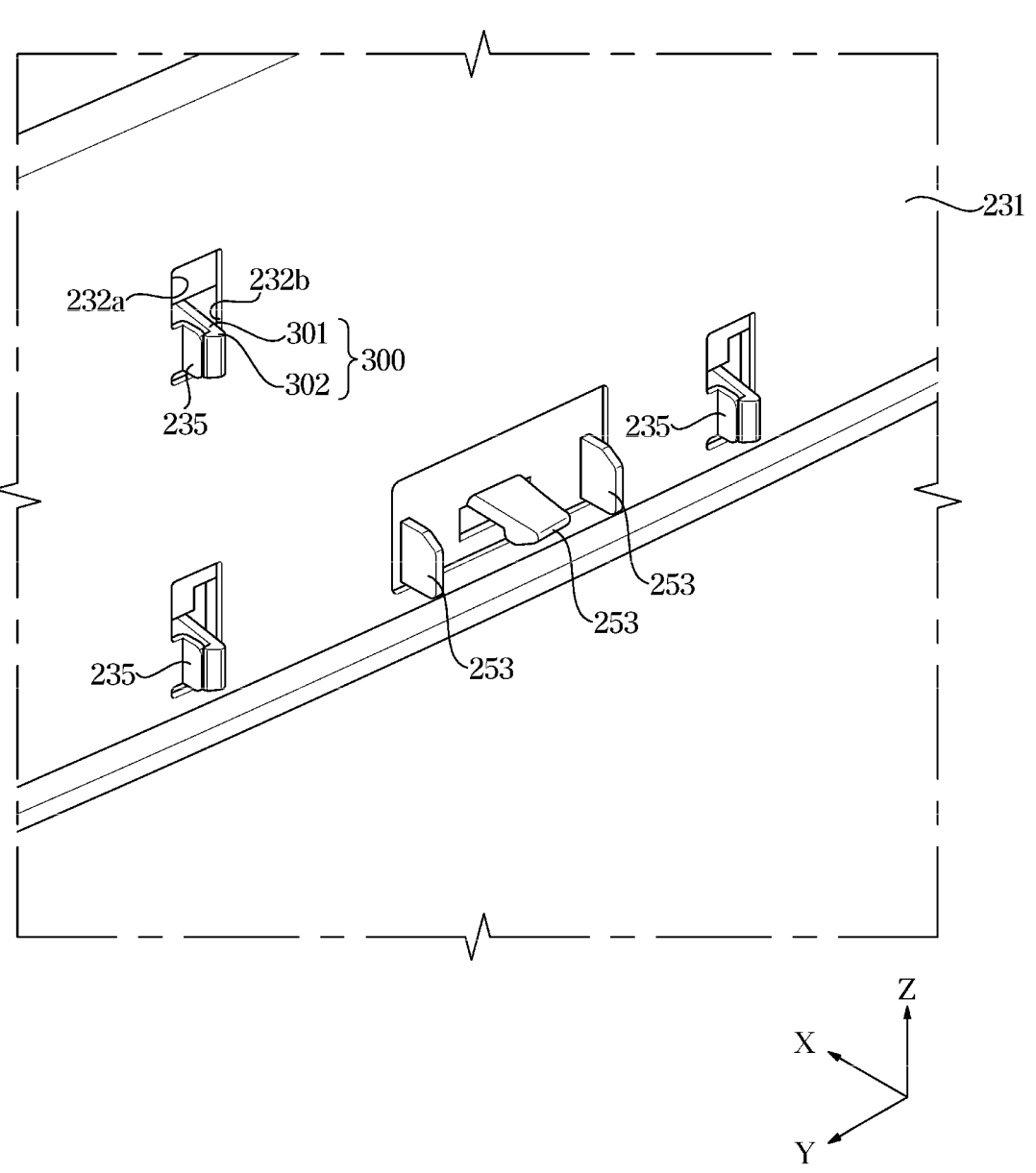
FIG. 23 is an enlarged view of the display apparatus according to an embodiment of the disclosure.

FIG. 21 is a perspective view of a display apparatus according to an embodiment. FIG. 22 is an exploded-perspective view of the display apparatus according to an embodiment. FIG. 23 is an enlarged view of the display apparatus according to an embodiment. FIG. 23 is an enlarged view of A in the display apparatus shown in FIG. 21.

Referring to FIGS. 21 to 23, a display apparatus according to an embodiment may include a support plate 230 and an inner plate 250. The inner plate 250 may be hooked to the support plate 230. For example, in the embodiments of FIGS. 5 and 6, the inner plate 50 may be coupled to the support plate 30 through the hook 100 and the fastening member 40, but in the embodiments of FIGS. 21 to 23, the inner plate 250 may be coupled to the support plate 230 only through a hook 300. Accordingly, it is possible to implement a screwless structure. A plurality of hooks 300 may be provided. The inner plate 250 may further include a fixing protrusion 253.

The hook 300 may include a protrusion 301 and a stopper 302. The protrusion 301 may protrude rearward from a support base 231. For example, the protrusion 301 may extend rearward from a plate portion. In the embodiment shown in FIGS. 5 and 6, a pair of protrusions 111 of the central hook 110 protruding from a single stepped portion 110*a* may be provided, but in the embodiment of FIGS. 21 to 23, a single protrusion 301 may be provided.

The stopper 302 may be formed at one end of the protrusion 301. For example, the stopper 302 may be provided at a rear end of the protrusion 301 and be in contact with a contact protrusion 235 of the support plate 230. While the inner plate 250 is being mounted on the support plate 230, a front surface of the stopper 302 may be in contact with a rear surface of the contact protrusion 235.

According to the present disclosure, it is possible to provide a display apparatus configured to separate a display panel from a support plate without damage to a control board configured to control the display panel.

According to the present disclosure, even if some components are defective, it is possible to recycle a component that does not have a defect, and thus it is possible to provide a display apparatus with reduced production and material costs.

Additional aspects of the disclosure will be set forth in part in the description which follows and, in part, will be obvious from the description, or may be learned by practice of the disclosure.

The display apparatus according to an embodiment may include the display panel 10, the rear cover disposed behind the display, the support plate 30, 130 or 230 configured to support the display and disposed between the display and the rear cover, and the control board 13 configured to control the display and disposed between the display and the support plate.

The display apparatus according to an embodiment may include the board holder 50, 150, or 250 disposed between the display and the support plate to fix the control board and configured to be slidably mountable on the support plate, and the coupling portions 32 and 100, 152 and 200, and 300 that hook the board holder and the support plate so that the board holder is mountable on the support plate.

In the display apparatus according to an embodiment, the coupling portions 32 and 100, 152 and 200, and 300 may include the hook 100 or 300 protruding from the board holder toward the support plate, and the insertion hole 32 formed in the support plate into which the hook is inserted.

In the display apparatus according to an embodiment, the board holder 50 may extend in one direction.

In the display apparatus according to an embodiment, the hook 100 or 300 may include the central hook 110 protruding from a middle portion of the board holder, and the side hook 120 protruding from an end portion with respect to the one direction of the board holder.

In the display apparatus according to an embodiment, each of the central hook 110 and the side hook 120 may include the protrusion 111, 121, or 301 protruding rearward from the board holder, and the stopper 112, 122, or 302 extending from the protrusion to a direction different from a protruding direction of the protrusion.

In the display apparatus according to an embodiment, the board holder 50, 150, or 250 may have the first position P1 in which the hook is inserted into the support plate, and the second position P2 in which the board holder slides downward and the hook is mounted on the support plate.

In the display apparatus according to an embodiment, the insertion hole 32 may include the first portion 33*a*, 34*a* into which the hook is inserted at the first position of the board holder, and the second portion 33*b*, 34*b* provided below the first portion and having a cross-sectional area of the second portion less than a cross-sectional area of the first portion so that the hook is mounted on the support plate at the second position of the board holder.

In the display apparatus according to an embodiment, the support plate 30 or 230 may include the contact protrusion 35 or 235 protruding rearward to prevent the separation of the stopper of the central hook at the second position of the board holder.

In the display apparatus according to an embodiment, the front surface 112*a* of the stopper of the central hook and the rear surface 35*a* of the contact protrusion may be in contact with at the second position of the board holder.

In the display apparatus according to an embodiment, the support plate 30 or 230 may include the inner protrusion 36 protruding into the insertion hole to prevent the separation of the stopper of the side hook at the second position of the board holder.

In the display apparatus according to an embodiment, the front surface 122*a* of the stopper of the side hook may be in contact with the inner protrusion 36 at the second position of the board holder.

In the display apparatus according to an embodiment, the rear cover, the support plate, and the board holder may be fastened by the fastening member 40 inserted toward the rear cover from the rear side.

In the display apparatus according to an embodiment, the control board 13 may be attached to the display in the lower portion of the display.

The display apparatus according to an embodiment may further include the adhesive member 60 provided to attach the display to the support plate and the board holder.

In the display apparatus according to an embodiment, the adhesive member 60 may include the first adhesive member 61 disposed between the display and the support plate to attach the display to the support plate, and provided to extend in a vertical direction, and the second adhesive member 62 disposed between the display and the board holder to attach the display to the board holder and disposed below the first adhesive member.

In the display apparatus according to an embodiment, the display may be configured to be separated from the support plate together with the board holder based on the board holder being separated from the support plate.

The display apparatus according to an embodiment may include the display panel 10, the rear cover disposed behind the display, and the support plate 30, 130 or 230 disposed between the display and the rear cover and including the mounting hole 32.

The display apparatus according to an embodiment may include the inner plate 50, 150, or 250 provided to extend in one direction, disposed between the display and the support plate, and mounted on the support plate, the central hook 110 protruding from a middle portion of the inner holder, and the plurality of side hooks 120 protruding rearward from both ends of the inner plate so as to be inserted into the mounting hole 32.

In the display apparatus according to an embodiment, each of the central hook 110 and the plurality of side hooks 120 may include the protrusion 111, 121, or 301 protruding rearward from the inner plate, and the stopper 112, 122, or 302 extending from the protrusion to a direction different from a protruding direction of the protrusion.

In the display apparatus according to an embodiment, the inner plate 50, 150, or 250 may have the first position P1 in which the central hook and the side hook are inserted into the support plate, and the second position P2 in which the inner plate slides downward and the central hook and the side hook are mounted on the support plate.

In the display apparatus according to an embodiment, the insertion hole 32 may include the first portion 33*a*, 34*a* into which the central hook and the side hook are inserted at the first position of the inner plate, and the second portion 33*b*, 34*b* provided below the first portion and having a cross-sectional area less than that of the first portion so as to allow the central hook and the side hook to be mounted on the support plate at the second position of the inner plate.

The display apparatus according to an embodiment may include the display 10 having a curvature and including the self-luminous panel 11, the rear cover 20 disposed behind the display, the support plate 30, 130, or 230 disposed between the display and the rear cover, the control board 13 configured to control the display and attached to a rear side of the display, and the board holder 50, 150, or 250 attached to the control board from a rear side of the control board and configured to be slidably mountable on the support plate.

The display apparatus according to an embodiment may include the hook 100 or 300 protruding rearward from the board holder so as to be mounted on the support plate.

In the display apparatus according to an embodiment, the display may be configured to be separated from the support plate together with the board holder based on the board holder being separated from the support plate.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
a display;
a rear cover behind the display;
a support plate including an insertion hole, the support plate between the display and the rear cover, and configured to support the display;
a control board connected to, and configured to control, the display; and
a board holder including a hook that is insertable into the insertion hole, the board holder on a rear side of the control board and couplable to the support plate,
wherein the board holder and the support plate are configured such that,
with the hook inserted into the insertion hole, and
with the support plate slid in a first direction relative to the board holder and/or the board holder slid in a second direction, opposite the first direction, relative to the support plate,
the board holder is coupled to the support plate.

2. The display apparatus of claim 1, wherein
the hook protrudes from a rear surface of the board holder toward the support plate.

3. The display apparatus of claim 1, wherein
the hook includes:
a central hook that protrudes toward the support plate from a middle portion of the board holder in a lengthwise direction of the board holder,
a side hook that protrudes toward the support plate from a position between the central hook and an end portion of the board holder in the lengthwise direction, and
the insertion hole includes:
a first insertion hole into which the central hook is insertable,
a second insertion hole into which the side hook is insertable, and
with the central hook inserted into the first insertion hole and the side hook inserted into the second insertion hole, and
with the support plate slid in a first direction relative to the board holder and/or the board holder slid in a second direction, opposite the first direction, relative to the support plate,
the board holder is coupled to the support plate.

4. The display apparatus of claim 3, wherein
each of the central hook and the side hook include:
a protrusion that protrudes rearward from the board holder, and
a stopper that extends from the protrusion in a direction different from a direction that the protrusion protrudes.

5. The display apparatus of claim 4, wherein
with the central hook inserted into the first insertion hole and the side hook inserted into the second insertion hole, the board holder is positioned in a first position, and with the support plate slid in a first direction relative to the board holder and/or the board holder slid in a second direction, opposite the first direction, relative to the support plate, the board holder is positioned in a second position in which the board holder is coupled to the support plate.

6. The display apparatus of claim 5, wherein the first insertion hole includes:
   a first portion into which the central hook is insertable to be at the first position, and
   a second portion below the first portion and having a cross-sectional area that is less than a cross-sectional area of the first portion, and
the second insertion hole includes:
   a first portion into which the side hook is insertable to be at the first position, and
   a second portion below the first portion and having a cross-sectional area that is less than a cross-sectional area of the first portion, and
the central hook, the first insertion hole, the side hook, and the second insertion hole are configured such that,
with the central hook inserted into the first insertion hole and the side hook inserted into the second insertion hole, and
with the support plate slid in a first direction relative to the board holder and/or the board holder slid in a second direction, opposite the first direction, relative to the support plate,
   the central hook passes through the second portion of the first insertion hole and the side hook passes through the second portion of the second insertion hole such that the board holder is at the second position and the board holder is coupled to the support plate.

7. The display apparatus of claim 6, wherein the support plate includes:
   a contact protrusion that protrudes rearward and is configured such that, with the board holder in the second position, the contact protrusion contacts a stopper of the central hook and/or a stopper of the side hook to prevent separation of the board holder from the support plate in a direction opposite to the direction in which the hook is inserted into the insertion hole.

8. The display apparatus of claim 7, wherein with the board holder in the second position, a front surface of the stopper of the central hook and a rear surface of the contact protrusion are in contact.

9. The display apparatus of claim 8, wherein the support plate includes an inner protrusion that protrudes into the second insertion hole and is configured such that, with the board holder in the second position, a stopper of the side hook prevents separation of the board holder from the support plate in a direction opposite to the direction in which the hook is inserted into the insertion hole.

10. The display apparatus of claim 9, wherein with the board holder in the second position, a front surface of the stopper of the side hook and a rear surface of the inner protrusion are in contact.

11. The display apparatus of claim 10, wherein the rear cover, the support plate, and the board holder are fastened by a fastening member inserted from a rear side of the rear cover.

12. The display apparatus of claim 1, wherein the control board is attached to the display at a lower portion of the display.

13. The display apparatus of claim 12, further comprising:
an adhesive member that attaches the display to the support plate and the board holder.

14. The display apparatus of claim 13, wherein the adhesive member includes:
   a first adhesive member between the display and the support plate, and that attaches the display to the support plate, the first adhesive member extended longitudinally in a vertical direction, and
   a second adhesive member between the display and the board holder, and that attaches the display to the board holder, the second adhesive member below the first adhesive member in the vertical direction.

15. The display apparatus of claim 14, wherein the display, the board holder, and the support plate are configured such that, with the display supported by the support plate and the board holder coupled to the support plate, the display and the board holder are together separable from the support plate based on the board holder being separated from the support plate.

* * * * *